(12) United States Patent
Chandrashekar et al.

(10) Patent No.: US 8,435,894 B2
(45) Date of Patent: May 7, 2013

(54) DEPOSITING TUNGSTEN INTO HIGH ASPECT RATIO FEATURES

(75) Inventors: Anand Chandrashekar, Sunnyvale, CA (US); Raashina Humayun, Fremont, CA (US); Michal Danek, Cupertino, CA (US); Aaron R. Fellis, Sunnyvale, CA (US); Sean Chang, Cupertino, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 13/351,970

(22) Filed: Jan. 17, 2012

(65) Prior Publication Data

US 2012/0115329 A1    May 10, 2012

Related U.S. Application Data

(63) Continuation of application No. 13/016,656, filed on Jan. 28, 2011, now Pat. No. 8,124,531, which is a continuation-in-part of application No. 12/535,464, filed on Aug. 4, 2009, now Pat. No. 8,119,527, and a continuation-in-part of application No. 12/833,823, filed on Jul. 9, 2010.

(51) Int. Cl.
   *H01L 21/44* (2006.01)

(52) U.S. Cl.
   USPC ............... 438/685; 438/675; 257/E21.586

(58) Field of Classification Search ............ 438/641
See application file for complete search history.

(56) References Cited

U.S. PATENT DOCUMENTS

| | | |
|---|---|---|
| 5,164,330 A | 11/1992 | Davis et al. |
| 5,747,379 A | 5/1998 | Huang et al. |
| 5,767,015 A | 6/1998 | Tabara |
| 5,807,786 A | 9/1998 | Chang |
| 5,866,483 A | 2/1999 | Shiau et al. |
| 6,011,311 A | 1/2000 | Hsing et al. |
| 6,221,754 B1 | 4/2001 | Chiou et al. |
| 6,245,654 B1 | 6/2001 | Shih et al. |
| 6,376,376 B1 | 4/2002 | Lim et al. |
| 6,593,233 B1 | 7/2003 | Miyazaki et al. |

(Continued)

OTHER PUBLICATIONS

C.K. Tsang et al, "CMOS-Compatible Through Silicon Vias for 3D Process Integration", Materials Research Society 2007 Symposium Proceedings vol. 970, paper 0970-Y01-01.

(Continued)

*Primary Examiner* — Cheung Lee
(74) *Attorney, Agent, or Firm* — Weaver Austin Villeneuve & Sampson LLP

(57) ABSTRACT

Methods and apparatuses for filling high aspect ratio features with tungsten-containing materials in a substantially void-free manner are provided. In certain embodiments, the method involves depositing an initial layer of a tungsten-containing material followed by selectively removing a portion of the initial layer to form a remaining layer, which is differentially passivated along the depth of the high-aspect ration feature. In certain embodiments, the remaining layer is more passivated near the feature opening than inside the feature. The method may proceed with depositing an additional layer of the same or other material over the remaining layer. The deposition rate during this later deposition operation is slower near the feature opening than inside the features due to the differential passivation of the remaining layer. This deposition variation, in turn, may aid in preventing premature closing of the feature and facilitate filling of the feature in a substantially void free manner.

13 Claims, 10 Drawing Sheets

U.S. PATENT DOCUMENTS

| | | | |
|---|---|---|---|
| 6,683,000 B2 | 1/2004 | Fukui et al. | |
| 7,193,369 B2 | 3/2007 | Min et al. | |
| 7,578,944 B2 | 8/2009 | Min et al. | |
| 7,993,460 B2 | 8/2011 | Steger | |
| 8,119,527 B1 | 2/2012 | Chandrashekar et al. | |
| 8,124,531 B2 | 2/2012 | Chandrashekar et al. | |
| 8,129,270 B1 | 3/2012 | Chandrashekar et al. | |
| 8,153,520 B1 | 4/2012 | Chandrashekar et al. | |
| 2002/0177325 A1 | 11/2002 | Takewaka et al. | |
| 2003/0082902 A1* | 5/2003 | Fukui et al. | 438/629 |
| 2004/0079632 A1 | 4/2004 | Ahmad et al. | |
| 2004/0245091 A1 | 12/2004 | Karim et al. | |
| 2005/0031786 A1 | 2/2005 | Lee et al. | |
| 2005/0250316 A1 | 11/2005 | Choi et al. | |
| 2005/0275941 A1 | 12/2005 | Liu et al. | |
| 2006/0084269 A1 | 4/2006 | Min et al. | |
| 2006/0094238 A1 | 5/2006 | Levy et al. | |
| 2007/0187362 A1 | 8/2007 | Nakagawa et al. | |
| 2008/0254623 A1 | 10/2008 | Chan et al. | |
| 2010/0072623 A1 | 3/2010 | Prindle et al. | |
| 2010/0144140 A1 | 6/2010 | Chandrashekar et al. | |
| 2011/0159690 A1 | 6/2011 | Chandrashekar et al. | |
| 2012/0009785 A1 | 1/2012 | Chandrashekar et al. | |

OTHER PUBLICATIONS

U.S. Patent Application entitled, "Depositing Tungsten Into High Aspect Ratio Features", U.S. Appl. No. 12/535,464, filed Aug. 4, 2009.

U.S. Patent Application entitled, "Thinning Tungsten Layer After Through Silicon Via Filling", U.S. Appl. No. 12/534,566, filed Aug. 3, 2009.

U.S. Patent Application entitled, "Method for Depositing Tungsten Film Having Low Resistivity, Low Roughness and High Reflectivity", U.S. Appl. No. 12/332,017, filed Dec. 10, 2008.

U.S. Office Action for U.S. Appl. No. 12/332,017, mailed Dec. 30, 2009.

Final Office Action for U.S. Appl. No. 12/332,017 mailed Jul. 26, 2010.

U.S. Office Action for U.S. Appl. No. 12/535,464 mailed Sep. 13, 2010.

U.S. Office Action for U.S. Appl. No. 12/332,017 mailed Nov. 15, 2010.

U.S. Office Action for U.S. Appl. No. 12/535,377 mailed Nov. 1, 2010.

U.S. Patent Application entitled, "Depositing tungsten into high aspect ratio features", U.S. Appl. No. 12/833,823, filed Jul. 9, 2010.

U.S. Final Office Action for U.S. Appl. No. 12/202,126 mailed Feb. 7, 2011.

U.S. Final Office Action for U.S. Appl. No. 12/535,464 mailed Apr. 14, 2011.

U.S. Office Action for U.S. Appl. No. 12/535,377 mailed Jun. 14, 2011.

U.S. Final Office Action for U.S. Appl. No. 12/332,017 mailed Jul. 22, 2011.

U.S. Office Action for U.S. Appl. No. 12/535,464 mailed Jul. 28, 2011.

U.S. Office Action for U.S. Appl. No. 12/534,566 mailed Sep. 2, 2011.

Dimensions of Wafer as described by Wikipedia, 2008.

Deposition Process, Oxford Electronics, 1996.

KR patent application No. 10-2009-0122292, Office Action mailed Aug. 29, 2011.

Korean Patent Abstracts, Publication No. 1020030035877, published May 9, 2003, downloaded from http://kpa.kipris.or.kr/kpa2010 on Aug. 29, 2011.

Office Action mailed Sep. 2, 2011 from U.S. Appl. No. 12/534,566.

Office Action mailed Oct. 12, 2011 from U.S. Appl. No. 12/535,464.

Office Action mailed Nov. 25, 2011 from U.S. Appl. No. 13/016,656.

Notice of Allowance mailed Oct. 28, 2011 from U.S. Appl. No. 12/332,017.

Final Office Action mailed Dec. 1, 2011 from U.S. Appl. No. 12/535,377.

Notice of Allowance mailed Dec. 20, 2011 from U.S. Appl. No. 12/534,566.

Notice of Allowance mailed Dec. 30, 2011 from U.S. Appl. No. 12/535,464.

Notice of Allowance mailed Jan. 9, 2012 from U.S. Appl. No. 13/016,656.

Examination and Search Report for Application No. 201005237-1, mailed Dec. 14, 2011.

U.S. Office Action for U.S. Appl. No. 12/833,823 mailed Mar. 13, 2012.

Korean Provisional Rejection mailed Nov. 16, 2012, from Application No. 2011-0068603 [NOVLP404KR].

* cited by examiner

DEPOSITING TUNGSTEN INTO HIGH ASPECT RATIO FEATURES

CROSS-REFERENCE TO RELATED APPLICATIONS

This application is a continuation of U.S. patent application Ser. No. 13/016,656, entitled "DEPOSITING TUNGSTEN INTO HIGH ASPECT RATIO FEATURES" by CHANDRASHEKAR et al., filed on Jan. 28, 2011, which application is a continuation-in-part of U.S. patent application Ser. No. 12/535,464, entitled "DEPOSITING TUNGSTEN INTO HIGH ASPECT RATIO FEATURES" by CHANDRASHEKAR et al., filed on Aug. 4, 2009. U.S. patent application Ser. No. 13/016,656 is also a continuation-in-part of U.S. patent application Ser. No. 12/833,823 entitled "DEPOSITING TUNGSTEN INTO HIGH ASPECT RATIO FEATURES" by CHANDRASHEKAR et al., filed on Jul. 9, 2010.

BACKGROUND

Deposition of tungsten-containing materials using chemical vapor deposition (CVD) techniques is an integral part of many semiconductor fabrication processes. These materials may be used for horizontal interconnects, vias between adjacent metal layers, contacts between first metal layers and devices on the silicon substrate, and high aspect ratio features. In a conventional deposition process, a substrate is heated to a predetermined process temperature in a deposition chamber, and a thin layer of tungsten-containing materials that serves as a seed or nucleation layer is deposited. Thereafter, the remainder of the tungsten-containing material (the bulk layer) is deposited on the nucleation layer. Conventionally, the tungsten-containing materials are formed by the reduction of tungsten hexafluoride ($WF_6$) with hydrogen ($H_2$). Tungsten-containing materials are deposited over an entire exposed surface area of the substrate including features and a field region.

Depositing tungsten-containing materials into small and, especially, high aspect ratio features may cause formation of seams (e.g., unfilled voids) inside the filled features. Large seams may lead to high resistance, contamination, loss of filled materials, and otherwise degrade performance of integrated circuits. For example, a seam may extend close to the field region after filling process and then open during chemical-mechanical planarization.

SUMMARY

Methods and apparatuses for filling high aspect ratio features with tungsten-containing materials in a substantially void-free manner are provided. In certain embodiments, the method involves depositing an initial layer of a tungsten-containing material followed by selectively removing a portion of the initial layer to form a remaining layer, which is differentially passivated along the depth of the high-aspect ration feature. In certain embodiments, the remaining layer is more passivated near the feature opening than inside the feature. The method may proceed with depositing an additional layer of the same or other material over the remaining layer. The deposition rate during this later deposition operation is slower near the feature opening than inside the features due to the differential passivation of the remaining layer. This deposition variation, in turn, may aid in preventing premature closing of the high-aspect ratio feature and facilitate filling of the feature in a substantially void free manner.

In certain embodiments, a method of filling a high aspect ratio feature, which is provided on a partially manufactured semiconductor substrate, involves introducing a tungsten-containing precursor and reducing agent into a processing chamber and depositing a layer of a tungsten-containing material on the substrate via a chemical vapor deposition reaction between the tungsten-containing precursor and reducing agent. The deposited layer at least partially fills the feature. The method continues with introducing an activated etching material into the processing chamber and removing a portion of the deposited layer using the activated etching material to form a remaining layer. The method then proceeds with reintroducing the tungsten-containing precursor and reducing agent into the chamber and selectively depositing an additional layer of the tungsten-containing material on the substrate, over the remaining layer, via a chemical vapor deposition reaction between the precursor and reducing agent. The additional deposited layer is thicker inside the feature than near the feature's opening. For purposes of this document, the term "inside the feature" represent a middle portion of the feature located about the middle point of the feature along the feature's depth, e.g., an area between about 25% and 75% or, more specifically, between about 40% and 60% along the feature's depth measured from the feature's opening. The term "near the opening of the feature" or "near the feature's opening" represents a top portion of the feature located within 25% or, more specifically, within 10% of the opening's edge or other element representative of the opening's edge.

In certain embodiments, the processing chamber is be maintained at a pressure of less than 5 Torr while removing the portion of the deposited layer. The processing chamber may be maintained at a pressure of less than 2 Torr during this operation. In certain embodiments, the remaining layer is selectively or differentially passivated such that this passivation is greater near the feature's opening than inside the feature. For purposes of this document, a layer is said to be "passivated" when the layer inhibits deposition of additional materials over the passivate layer's surface. A more passivated layer causes a slower deposition and/or delayed deposition than a similar but less passivated layer. In the same or other embodiments, the remaining layer is thinner near the feature's opening than inside the feature. The remaining layer may have a thickness of less than 10% of the feature's opening in some embodiments. More tungsten-containing material may be removed near the feature's opening than inside the feature during the removal operation. For example, a reduction in a thickness of the deposited layer (to form the remaining layer) near the opening of the high aspect ratio feature may be at least about 25% greater than inside the feature.

In certain embodiments, selectively depositing the additional layer involves filling, in a substantially void-free manner, at least a lower half of the high aspect ratio feature. The high-aspect ratio feature has an aspect ratio of at least about 2. In the same or other embodiments, removing the portion of the deposited layer is performed in a mass transport regime. An apparatus containing multiple processing chambers may be used for filing the high-aspect ratio feature. In these embodiments, depositing the layer of the tungsten-containing material, removing the portion of the deposited layer, and selectively depositing the additional layer of the tungsten-containing material may be performed in different processing chambers maintained at different environmental conditions. In certain embodiments, the substrate has a second feature that is closed during the deposition operation and remains closed after the removal operation. In the same or another embodiment, the high aspect ratio feature is closed during the deposition operation and opens during the selective removal.

In certain embodiments, the method also involves applying photoresist to the partially manufactured semiconductor substrate, exposing the photoresist to light, and patterning the photoresist to create a pattern and transferring the pattern to the partially manufactured semiconductor substrate.

Provided also is a method that involves introducing a tungsten-containing precursor and a reducing agent into a processing chamber and depositing a layer of a tungsten-containing material on the partially manufactured semiconductor substrate via a chemical vapor deposition reaction between the tungsten-containing precursor and reducing agent. The deposited layer partially fills the high aspect ratio feature. The method continues with introducing an activated etching material into the processing chamber and selectively removing a portion of the deposited layer to form a remaining layer of the tungsten-containing material. The remaining layer has various levels of passivation along the depth of the high aspect ratio feature and being more passivated near a feature opening than inside the feature. The levels of passivation of the remaining layer may depend on amounts of the tungsten-containing material removed from specific areas of the layer to form the remaining layer. For example, more material may be removed near the feature opening than inside the feature. In certain embodiments, the method also includes depositing additional tungsten-containing material into the high aspect ratio feature, such that more material is deposited inside the feature than near the feature opening due to the remaining layer having various levels of passivation along the depth of the feature.

Provided also is a method that involves providing the partially manufactured semiconductor substrate having a high aspect ratio feature that is less than about 50 nanometers in size and has an aspect ration of at least about 4. The substrate may also include a protective layer deposited at least within this feature. The method proceeds with introducing a tungsten-containing precursor and a reducing agent into the chamber and depositing a layer of a tungsten-containing material on the substrate via a chemical vapor deposition reaction between the tungsten-containing precursor and reducing agent. The layer has a thickness of less than about half the size of the feature to prevent closure of the feature. The method then continues with introducing an activated etching material into the processing chamber and removing a portion of the deposited layer using the activated etching material at a pressure of less than 5 Torr for a period of time determined by the thickness of the deposited layer. The method proceeds with introducing again the tungsten-containing precursor and reducing agent into the chamber and selectively depositing an additional layer of the tungsten-containing material on the substrate, over the remaining layer, via the chemical vapor deposition reaction between the tungsten-containing precursor and the reducing agent. The deposition is performed such that an interior deposition rate inside the feature is at least twice higher than an exterior deposition rate near the feature opening. The selective deposition may be configured to fill at least a bottom half of the feature. In certain specific embodiments, the high aspect ratio feature is about 30 nanometers in size and has a depth of about 250 nanometers. In these embodiments, the duration of the removal operation may be between about 1 second and 10 seconds. In certain embodiments, the exterior deposition rate is less than about 100 Angstroms per minute for at least first 30 seconds of the selective deposition.

Provided also is a semiconductor processing apparatus for filling a high aspect ratio feature on a partially manufactured semiconductor substrate. The apparatus may include a first processing chamber having one or more deposition stations for positioning the substrate. The first processing chamber is configured to deposit a layer of a tungsten-containing material on the substrate via a chemical vapor deposition reaction. The one or more deposition stations may include a deposition heating element for controlling a temperature of the substrate during deposition. The apparatus also include a second processing having one or more etching stations for positioning the substrate. The second processing chamber is configured to remove a portion of the deposited layer. The one or more etching stations may include an etching heating element for controlling the temperature of the substrate during etching. Furthermore, the apparatus includes a controller comprising program instructions for introducing the tungsten-containing precursor and the reducing agent into the first processing chamber. In certain embodiments, additional instructions include, after introducing the tungsten-containing precursor and the reducing agent into the first processing chamber, introducing an activated etching material into the second processing chamber at a pressure of less than 5 Ton for a period of between about 1 second and 10 seconds. The instructions further include, after introducing an activated etching material into the second processing chamber, introducing the tungsten-containing precursor and the reducing agent into the first processing chamber or another processing chamber. In certain embodiments, the apparatus also includes a wafer stepper.

Provided also is a non-transitory computer machine-readable medium including program instructions for control of a semiconductor processing apparatus for filling a high aspect ratio feature provided on a partially manufactured semiconductor substrate. In certain embodiments, the program instructions include code for introducing the tungsten-containing precursor and the reducing agent into the first processing chamber, code for introducing an activated etching material into the second processing chamber at a pressure of less than 5 Torr for a period of between about 1 second and 10 seconds, and code for introducing the tungsten-containing precursor and the reducing agent into the first processing chamber or another processing chamber.

These and other aspects of the invention are further described in more detail with reference to the corresponding drawings.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.
Introduction Filling features with tungsten-containing materials may cause formation of seams inside the filled features. A seam can form when a layer that is being deposited on the side walls of the feature thickens to the point that it seals off (i.e., forms a pinch point, also referred to as a sealing point) a void space below this point from the environment of the processing chamber. In the other words, thickening of the deposited layer pinches off a void space. This pinching prevents precursors and/or other reactants from entering remaining void spaces, and they remain unfilled. A void space is typically an elongated seam extending throughout a portion of the filled feature along the feature's depth direction. This void space or seam is also sometimes referred to as a keyhole because of its shape.

Figure 1:
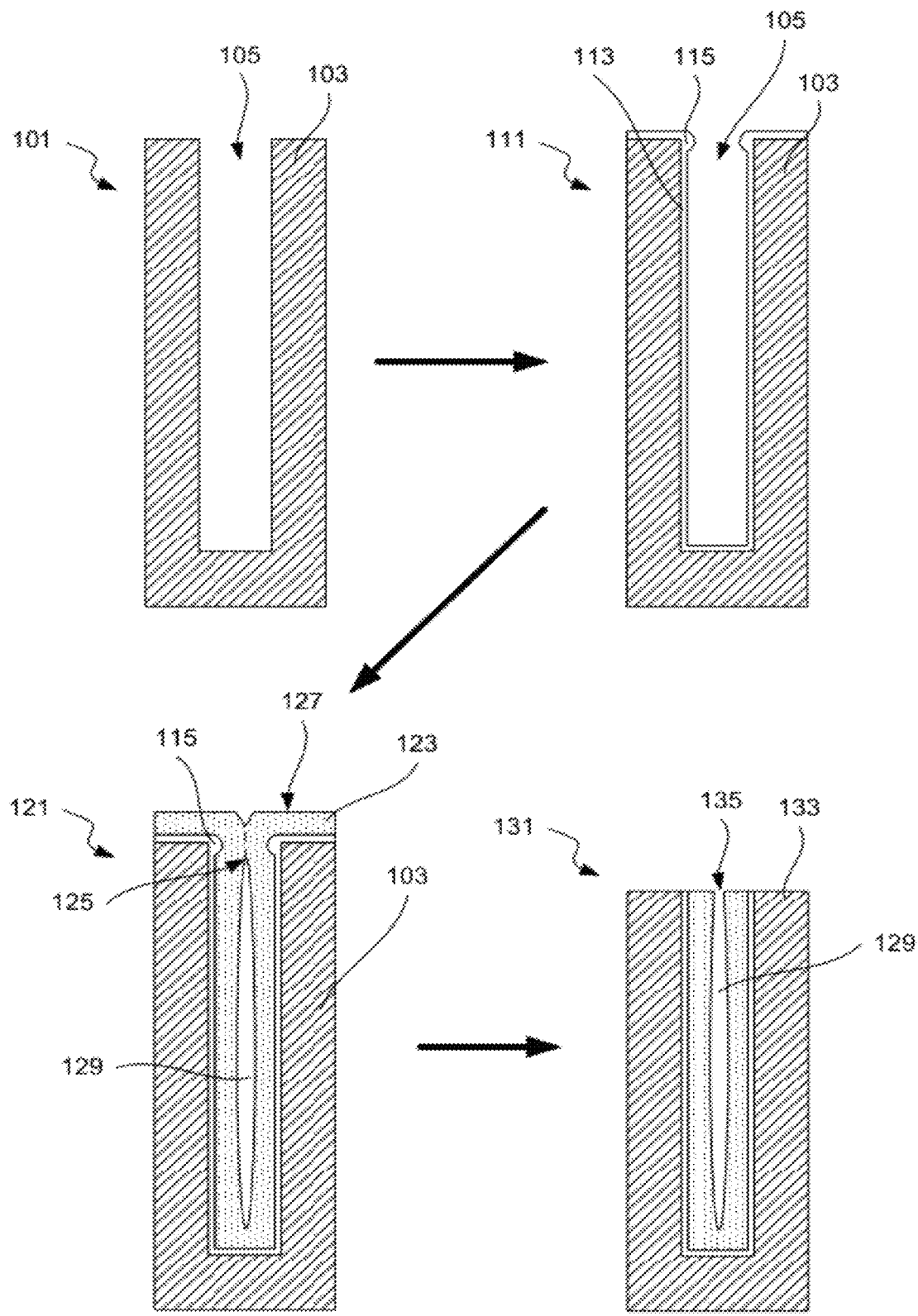
FIG. 1 illustrates an example of a semiconductor substrate containing a high aspect ratio feature at different stages of a process in accordance with certain embodiments.

There are multiple potential causes for seam formation. One is an overhang formed near the feature opening during deposition of tungsten-containing materials or, more typically, other materials, such as a diffusion barrier layer or a nucleation layer. FIG. 1 illustrates an example of a semiconductor substrate containing a high aspect ratio feature during different stages of semiconductor processing in accordance with certain embodiments. The first cross-section 101 shows a substrate 103 with a pre-formed feature hole 105. The substrate may be a silicon wafer, e.g., 200-mm wafer, 300-mm wafer, 450-mm wafer. The feature hole 105 may have an aspect ratio of at least about 2:1 or, in more specific embodiments, of at least about 4:1. The features hole 105 may also have a cross-section dimension near the opening (e.g., opening diameter, line width, etc.) of between about 10 nanometers to 500 nanometers, or more specifically between about 25 nanometers to 300 nanometers. The feature hole is sometimes referred to as an unfilled feature or simply a feature.

In the next stage (cross-section 111), the substrate 103 is shown with a deposited an under-layer 113 lining the feature hole 105, which may be a diffusion barrier layer, an adhesion layer, a nucleation layer, a combination of thereof, or any other applicable material. Because many deposition processes do not have good step coverage properties, i.e., more material is deposited on the field region and near the opening than inside the feature, the under-layer 113 may form an overhang 115. While the overhang 115 is a part of the under-layer 113, the layer 113 may be thicker near the opening than, for example, inside the feature. For the purposes of this description, "near the opening" is defined as an approximate position or an area within the feature (i.e., along the side wall of the feature) corresponding to between about 0-10% of the feature depth measured from the field region. In certain embodiments, the area near the opening corresponds to the area at the opening. Further, "inside the feature" is defined as an approximate position or an area within the feature corresponding to between about 20-60% of the feature depth measured from the field region on the top of the feature. Typically, when values for certain parameters (e.g., thicknesses) are specified "near the opening" or "inside the feature", these values represent a measurement or an average of multiple measurements taken within these positions/areas. In certain embodiments, an average thickness of the under-layer near the opening is at least about 10% greater than that inside the feature. In more specific embodiments, this difference may be at least about 25%, at least about 50%, or at least about 100%. Distribution of a material within a feature may also be characterized by its step coverage. For the purposes of this description, "step coverage" is defined as a ratio of two thicknesses, i.e., the thickness of the material inside the feature divided by the thickness of the material near the opening. In certain examples, the step coverage of the under-layer is less than about 100% or, more specifically, less than about 75% or even less than about 50%.

The next cross-section 121 illustrates the feature hole filled with the tungsten-containing materials 123. A deposition process may result in a conformal layer of the materials 123 built-up over the under-layer 113. This deposited layer follows the shape of the under-layer 113 including its overhang 115. In certain embodiments and, particularly, in later stages of the deposition process (e.g., right before feature closing), the layer 123 may become less conformal resulting in poor step coverage (i.e., more material being deposited near the opening than inside the feature). As the layer 123 thickens, it may close the feature forming a pinch point 125. Often some additional material is deposited above the pinch point 125 before the deposition process is stopped. Because of the overhang 115 and, in certain embodiments, the poor step coverage of the layer 123, the closed feature may have an unfilled void 129 (i.e., a seam) below the reference point 125. The size of the void 129 and the position of the reference point 125 with respect to the field region 127 depend on the size of the overhang 115, as well as the size, aspect ratio, and bowing of the feature, deposition process parameters, and other parameters.

Finally, cross-section 131 shows the substrate 133 after chemical-mechanical planarization (CMP), which removes a top layer from the substrate 103. CMP may be used to remove an overburden from the field region, such as parts of layers 113 and 123 that were present on the top surface of the substrate 103. Typically the substrate 103 is also thinned down during CMP to form the substrate 133. If the pinch point 125 falls above the planarization level of the CMP process, as in FIG. 1, the seam 129 opens up and is exposed to environment through the seam opening 135. The problems with open and large seams are described above.

Another cause that is not illustrated in FIG. 1 but that nevertheless may lead to seam formation or enlarging seams and moving the reference point closer to the field region is curved (or bowed) side walls of feature holes, which are also referred to as bowed features. In a bowed feature the cross-sectional dimension of the cavity near the opening is smaller than that inside the feature. Effects of these narrower openings in the bowed features are somewhat similar to the overhang problem described above. Further, bowed features may also have under-layers with overhangs and encounter other seam formation causes compounding negative effects of seam formation.

Complete eliminations of seams from the features filled with tungsten-containing materials may not be possible or practical. Some void spacing may remain inside the features, for example, due to large grains of the deposited materials, mass transport limitations during deposition, especially before feature closing, and other reasons. However, novel methods are presented herein that allow reducing seam sizes and moving reference points further away from the field region. These are collectively referred to as mitigating seam formation.

Process

It has been found that seam formation can be mitigated or, in some embodiments, eliminated by introducing one or more intermediate selective removal operations. For example, a filling process may start with forming an initial layer that at least partially fills a high aspect ratio feature. This operation is followed by partial selective removal of this initial layer and then depositing an additional layer. This removal-deposition cycle may be repeated until the feature is completely filled in a substantially void free manner. Process parameters may be selected such that the step coverage is improved at least one cycle. In certain embodiments, each cycle further improves the step coverage. Overall, selective removal can be characterized by more material removed near the opening than inside the feature. Various process control parameters may be employed to achieve these results including removal at mass-transport limiting conditions, controlling removal and/or adsorption rates of different etching components (e.g., activated and recombined species), controlling recombination rates of etching species, and others. For the purposes of this application, activated species, such as atomized species, radicals, and ions (e.g., atomic fluorine), are distinguished from recombined species, such as molecules including high energy state molecules (e.g., molecular fluorine), and from initial etchant species (e.g., nitrogen tri-fluoride and other precursors further described below).

Figure 2:
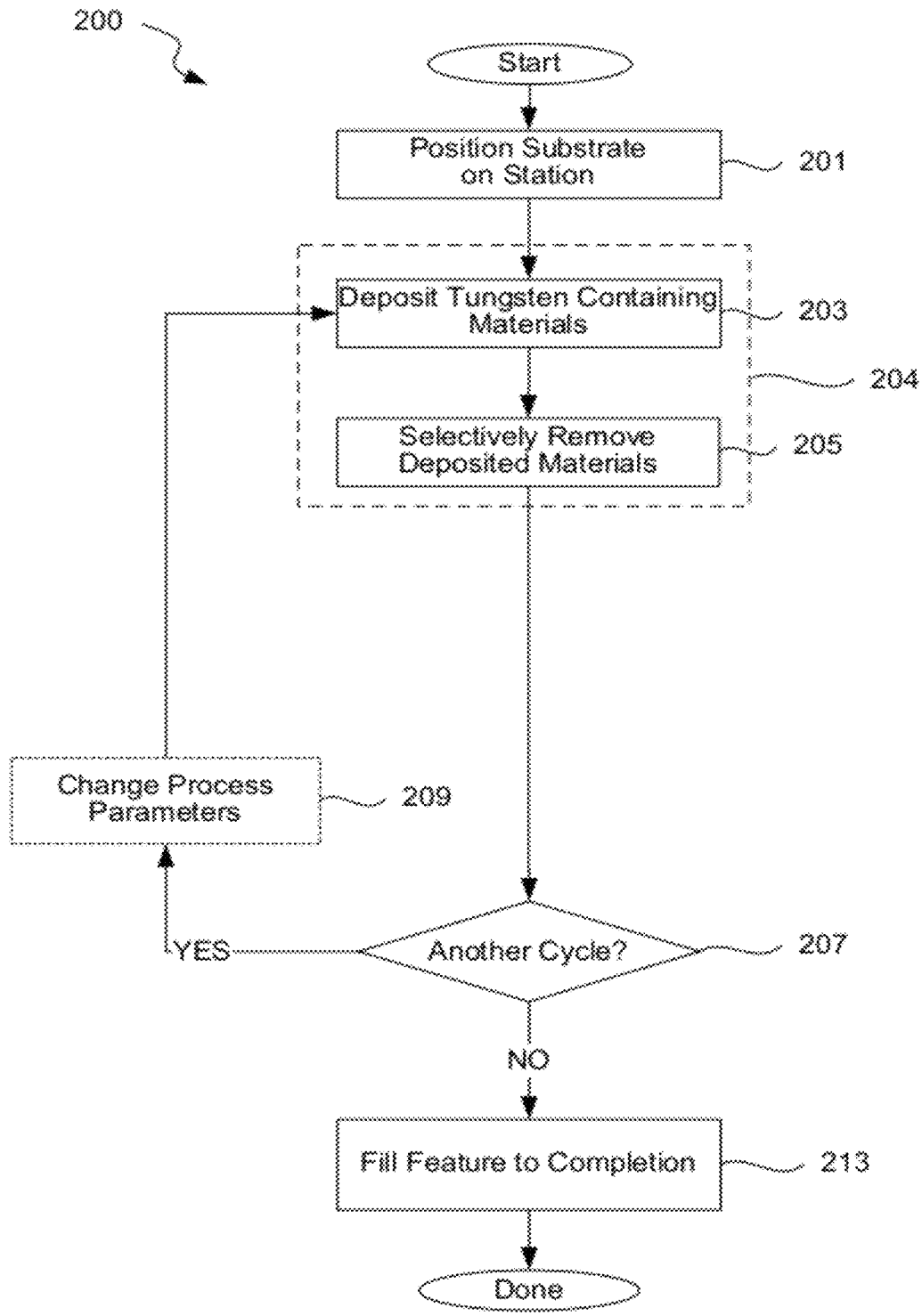
FIG. 2 illustrates a general process flowchart representing a method of filling high aspect ratio features with tungsten-containing materials in accordance with certain embodiments.

FIG. 2 illustrates a general process flowchart representing a method of filling high aspect ratio features with tungsten-containing materials in accordance with certain embodiments. A process 200 may start with positioning a substrate containing high aspect ratio features on a deposition station inside the processing chamber (block 201). The substrate may also have an under-layer, such as a diffusion barrier layer and/or tungsten nucleation layer. Certain substrate and under-layer details are provided above in the context of FIG. 1. In certain embodiments, an average thickness of an under-layer near the feature opening is at least about 25% greater than that inside the feature (e.g., near the bottom of the feature). In a more general sense, a substrate may have an under-layer that formed overhangs. In some cases, a layer of previously deposited bulk tungsten may be present in the feature. Features with overhangs are more prone to form voids during filling.

A diffusion barrier layer may be previously deposited onto the substrate to form a conformal layer that prevents diffusion of materials used to fill the features into surrounding materials of the substrate. Materials for the diffusion barrier layer may include tungsten nitride, titanium, titanium nitride, and others. The barrier layer may be between about 10 Angstroms and 500 Angstroms thick or, in more specific embodiments, between about 25 Angstroms and 200 Angstroms thick. In certain embodiments, a diffusion barrier layer is unevenly distributed on the substrate surface such that it forms overhang.

A nucleation layer is typically a thin conformal layer that facilitates subsequent deposition of bulk tungsten-containing material thereon. In certain embodiments, the nucleation layer is deposited using a pulsed nucleation layer (PNL) technique. In a PNL technique, pulses of the reducing agent, purge gases, and tungsten-containing precursor are sequentially injected into and purged from the reaction chamber. The process is repeated in a cyclical fashion until the desired thickness is achieved. PNL broadly embodies any cyclical process of sequentially adding reactants for reaction on a semiconductor substrate, including atomic layer deposition (ALD) techniques. PNL techniques for depositing tungsten nucleation layers are described in U.S. patent application Ser. No. 12/030,645 filed on Feb. 13, 2008, U.S. patent application Ser. No. 11/951,236, filed Dec. 5, 2007, and U.S. patent application Ser. Nos. 12/407,541, filed on Mar. 19, 2009, all of which are incorporated by reference herein its entirety for the purposes of describing tungsten deposition process. Additional discussion regarding PNL type processes can be found in U.S. Pat. Nos. 6,635,965, 6,844,258, 7,005,372 and 7,141,494 as well as in U.S. patent application Ser. No. 11/265,531, also incorporated herein by reference. In certain embodiments, a nucleation layer is unevenly distributed on the substrate surface such that it forms overhang. The methods described herein are not limited to a particular method of tungsten nucleation layer deposition, but include deposition of bulk tungsten film on tungsten nucleation layers formed by any method including PNL, ALD, CVD, PVD and any other method. Moreover, in certain embodiments, bulk tungsten may be deposited directly without use of a nucleation layer.

The deposition station may be also used to perform certain prior operations (e.g., deposition of a diffusion barrier layer, deposition of a nucleation layer) and/or subsequent operations (e.g., etching, another deposition, final feature filling). In certain embodiments, the deposition station may be specifically designated to perform deposition operation 203. The apparatus may also include additional deposition stations to perform the operation 203. For example, an initial deposition may be performed on the first deposition station. The substrate may be then moved to another station for etching. In certain embodiments further described below, an etching station is positioned in a different chamber to prevent cross-contamination between deposition and etching environments that use different materials and conditions for their respective operations. If the process then requires another deposition operation 203, the substrate may be returned back to the first deposition station or moved to another deposition station. Multiple deposition stations may be also used to perform parallel deposition operation 203 on several substrates. Additional details and apparatus embodiments are explained below in the context of FIG. 4 and FIGS. 5A-B.

The process may proceed with deposition of tungsten-containing materials onto the substrate (block 203). In certain embodiments, bulk deposition involves a chemical vapor deposition (CVD) process in which a tungsten-containing precursor is reduced by hydrogen to deposit tungsten. While tungsten hexafluoride ($WF_6$) is often used, the process may be performed with other tungsten precursors, including, but not limited to, tungsten hexachloride ($WCl_6$), organo-metallic precursors, and precursors that are free of fluorine such as MDNOW (methylcyclopentadienyl-dicarbonylnitrosyl-tungsten) and EDNOW (ethylcyclopentadienyl-dicarbonylnitrosyl-tungsten). In addition, while hydrogen is generally used as the reducing agent in the CVD deposition of the bulk tungsten layer, other reducing agents including silane may be used in addition or instead of hydrogen without departing from the scope of the invention. In another embodiment, tungsten hexacarbonyl ($W(CO)_6$) may be used with or without a reducing agent. Unlike with the PNL processes described above, in a CVD technique, the $WF_6$ and $H_2$ or other reactants are simultaneously introduced into the reaction chamber. This produces a continuous chemical reaction of mix reactant gases that continuously forms tungsten film on the substrate surface. Methods of depositing tungsten films using chemical vapor deposition (CVD) are described in U.S. patent application Ser. No. 12/202,126 filed Aug. 29, 2008, which is incorporated herein its entirety for the purposes of describing deposition processes. According to various embodiments, the methods described herein are not limited to a particular method of partially filling a feature but may include any appropriate deposition technique.

Figure 3:
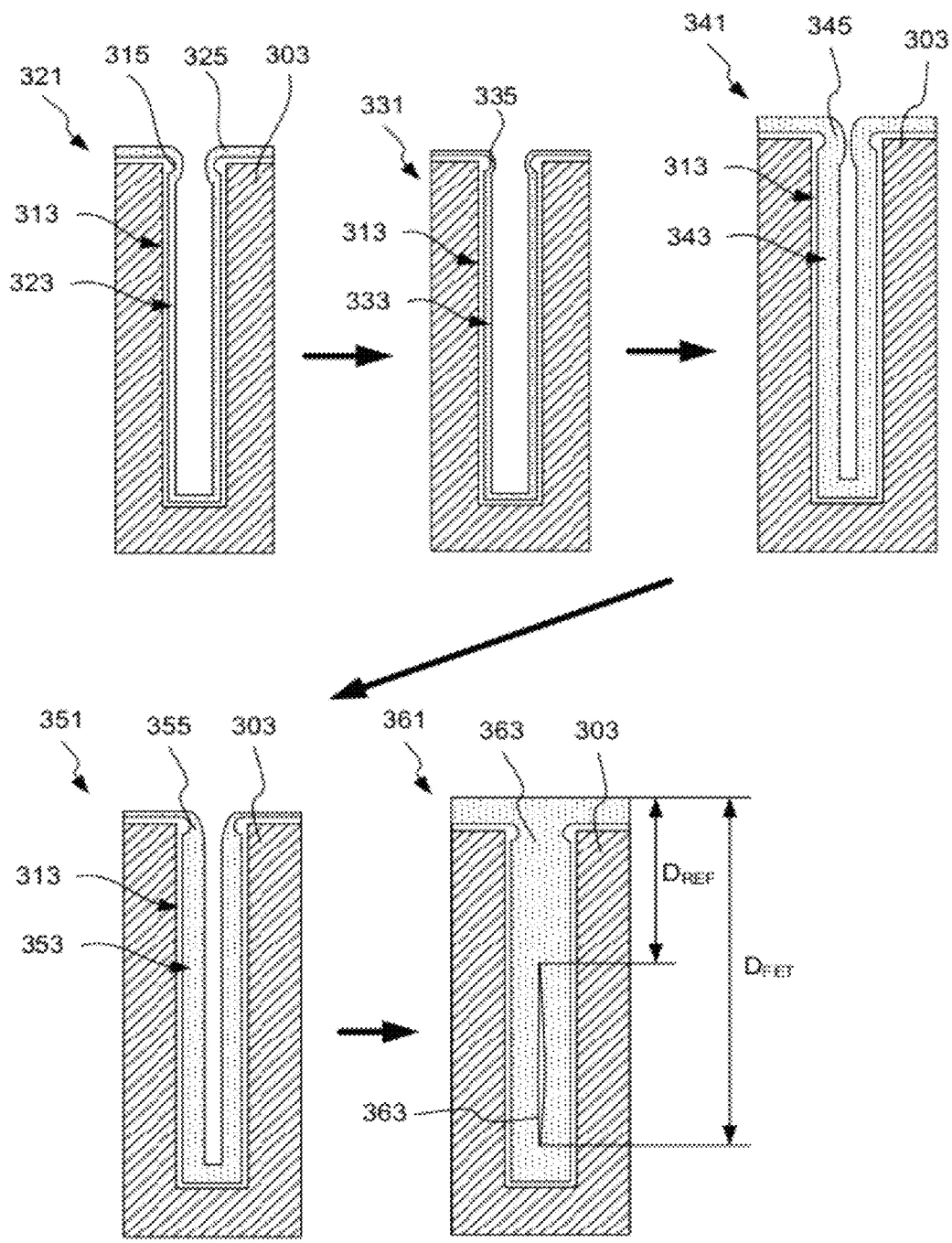
FIG. 3 illustrates schematic representations of substrate cross-sections at different stages of a filling process in accordance with certain embodiments.

FIG. 3 illustrates schematic representations of one example of the features' cross-sections at different stages of a filling process. Specifically, cross-section 321 represents an example of the feature after completing one of the initial deposition operations 203. At this stage of the process, substrate 303 may have a layer 323 of tungsten-containing materials deposited over under-layer 313. The size of the cavity near the opening may be narrower that inside the feature, for example, due to overhang 315 of the under-layer 313 and/or poor step coverage of the deposited layer 323, which are described in more detail above in the context of FIG. 1.

Returning to FIG. 2, the deposition operation 203 proceeds until the deposited layer (e.g., the layer 323) reaches a certain thickness. This thickness may depend on the cavity profile and opening size. In certain embodiments, the average thickness of the deposited layer near the opening may be between about 5% and 25% of the feature cross-sectional dimension including any under-layers, if ones are present. In other embodiments, the feature may be completely closed during the deposition operation 203 and then later re-opened during the selective removal operation (not shown).

In certain embodiments, a process chamber may be equipped with various sensors to perform in-situ metrology measurements to identify the extent of the deposition operation 203 and the removal operation 205. Examples of in-situ metrology include optical microscopy and X-Ray Fluorescence (XRF) for determining thickness of deposited films. Further, infrared (IR) spectroscopy may be used to detect amounts of tungsten fluorides (WFx) generated during etching operation. Finally, an under-layer, such as tungsten nucleation layer or a diffusion barrier layer, may be used as an etch-stop layer.

The process continues with a selective removal operation 205. Certain details of etching processes are described in U.S. patent application Ser. No. 12/535,377, entitled "METHOD FOR DEPOSITING TUNGSTEN FILM HAVING LOW RESISTIVITY, LOW ROUGHNESS AND HIGH REFLECTIVITY" by Chandrashekar et al., filed Aug. 4, 2009, which is incorporated herein in its entirety. The substrate may be moved from the deposition station to another station and, in more specific embodiment, another processing chamber with operating at different conditions, may continue being processed on the same station, or may be first removed from the deposition station (e.g., for storage) and then returned back to the deposition station for the selective removal of the deposited layer.

One way to achieve selective removal (i.e., to remove more deposited material near the opening than inside the feature) is to perform operation 205 in a mass transport limited regime. In this regime, the removal rate inside the feature is limited by amounts of and/or relative compositions of different etching material components (e.g., an initial etchant material, activated etchant species, and recombined etchant species) that diffuse into the feature. In certain examples, etching rates depend on various etchant components' concentrations at different locations inside the feature. It should be noted that the terms "etching" and "removal" are used interchangeably in this document. It should be understood that selective removal could be performed using any removal techniques, which includes etching as well as other techniques.

Mass transport limiting conditions may be characterized, in part, by overall etchant concentration variations. In certain embodiments, this concentration is less inside the feature than near its opening resulting in a higher etching rate near the opening than inside. This in turn leads to selective removal. Mass transport limiting process conditions may be achieved by supplying limited amounts of etchant into the processing chamber (e.g., use low etchant flow rates relative to the cavity profile and dimensions), while maintaining relative high etching rates in order to consume some etchant as it diffuses into the feature. In certain embodiment, a concentration gradient is substantial, which may be caused relatively high etching kinetics and relative low etchant supply. In certain embodiments, an etching rate near the opening may also be mass limited, but this condition is not required to achieve selective removal.

In addition to the overall etchant concentration variations inside high aspect ratio features, selective removal may be influenced by relative concentrations of different etchant components throughout the feature. These relative concentrations in turn depend by relative dynamics of dissociation and recombination processes of the etching species. As further described below, an initial etchant material is typically passed through a remote plasma generator and/or subjected to an in-situ plasma in order to generate activated etchant species (e.g., fluorine atoms, radicals). However, activated specifies tend to recombine into less active recombined etching species (e.g., fluorine molecules) and/or react with tungsten-containing materials along their diffusion paths. As such, different parts of the deposited tungsten-containing layer may be exposed to different concentrations of different etchant materials, e.g., an initial etchant, activated etchant species, and recombined etchant species. This provides additional opportunities for controlling selective removal as described below.

For example, activated fluorine species are generally more reactive with tungsten-containing materials than initial etching materials and recombined etching materials. Furthermore, as evident from FIG. 7, the activated fluorine species are generally less sensitive to temperature variations than the recombined fluorine species. Therefore, process conditions may be controlled in such a way that removal is predominantly attributed to activated fluorine species. Furthermore, specific process conditions may result in activated fluorine species being present at higher concentrations near features' openings than inside the features. For example, some activated species may be consumed (e.g., react with deposited materials and/or adsorbed on its surface) and/or recombined while diffusing deeper into the features, especially in small high aspect ratio features. It should be noted that recombination of activated species also occurs outside of high aspect ratio features, e.g., in the showerhead of the processing chamber, and depends on a chamber pressure. Therefore, a chamber pressure may be specifically controlled to adjust concentrations of activated etching species at various points of the chamber and features. These and other process conditions will now be described in more detail.

In certain embodiments, selective removal operation 205 involves introducing an initial etchant material into the processing chamber and using it to selectively remove the deposited layer. An etchant selection depends on a deposited material. While this description focuses on tungsten containing materials, such as tungsten and tungsten nitride, it should be understood that other materials may be used for partial or complete filling of high aspect ratio features. Some example of these materials include such as titanium, titanium nitride, tantalum, tantalum nitride, ruthenium, and cobalt. These materials can be deposited using Physical Vapor Deposition (PVD), Chemical Vapor Deposition (CVD), Atomic Layer Deposition (ALD), and other deposition techniques. In general, operation 205 may be used to selectively remove any materials formed inside high aspect ratio features, including diffusion barrier layers, nucleation layers, and/or filling materials.

Example of initial etchant materials that can be used for selective removal of tungsten containing materials and some other materials include nitrogen tri-fluoride ($NF_3$), tetrafluoro-methane ($CF_4$), tetrafluoroethylene ($C_2F_4$), hexafluoroethane ($C_2F_6$), and octafluoropropane ($C_3F_8$), tri-fluoromethane ($CHF_3$), sulfur hexafluoride ($SF_6$), and molecular fluorine ($F_2$). A process typically involves generating activate species, e.g., including radicals, ions, and/or high energy molecules. For example, an initial material may be flown through a remote plasma generator and/or subjected to an in-situ plasma.

Flow rates of the etchant typically depend on a size of the chamber, etching rates, etching uniformity, and other parameters. Typically, a flow rate is selected in such a way that more tungsten-containing material is removed near the opening than inside the feature. In certain embodiments, these flow rates cause mass-transport limited selective removal. For example, a flow rate for a 195-liter chamber per station may be between about 25 sccm and 10,000 sccm or, in more specific embodiments, between about 50 sccm and 1,000 sccm. In certain embodiments, the flow rate is less than about 2,000 sccm, less than about 1,000 sccm, or more specifically less than about 500 sccm. It should be noted that these values are presented for one individual station configured for processing a 300-mm wafer substrate. A person having ordinary skills in the art would understand that, for example, these flow rates can be scaled up or down depending on a substrate size, a number of stations in the apparatus (e.g., quadruple for a four station apparatus), a processing chamber volume, and other factors.

In certain embodiments, the substrate needs to be heated up or cooled down before the removal operation 205 can proceed. Various devices may be used to bring the substrate to the predetermined temperature, such as a heating or cooling element in a station (e.g., an electrical resistance heater installed in a pedestal or a heat transfer fluid circulated through a pedestal), infrared lamps above the substrate, igniting plasma, etc.

A predetermined temperature for the substrate is selected in such a way to not only induce a chemical reaction between the deposited layer and various etchant species but also to control the rate of the reaction between the two. For example, a temperature may be selected to have high removal rates such that more material is removed near the opening than inside the feature. Furthermore, a temperature may be also selected to control recombination of activated species (e.g., recombination of atomic fluorine into molecular fluorine) and/or control which species (e.g., activated or recombined species) contribute predominantly to etching. Overall, the substrate temperature may be selected based on etchant chemical compositions, a desired etching rate, desired concentration distributions of activated species, desired contributions to selective removal by different species, and other material and process parameters. In certain embodiments, a substrate is maintained at less than about 300° C., or more particularly at less than about 250° C., or less than about 150° C., or even less than about 100° C. In other embodiments, a substrate is heated to between about 300° C. and 450° C. or, in more specific embodiments, to between about 350° C. and 400° C. Other temperature ranges may be used for different types of etchants.

It has been determined that activated species provide not only faster but also more desirable selective removal than their recombined counterparts. As such, various approaches have been developed to increase relative concentrations and/or removal contributions of the activated species. For example, activation energy of activated fluorine species is much less than that of the recombined fluorine. Therefore, lowering substrate temperatures may result in more removal contribution from activated species. At certain temperatures (and other process conditions, e.g., flow rates and chamber pressures), a relative removal contribution of the activated species may exceed that of the recombined species.

Figure 7:
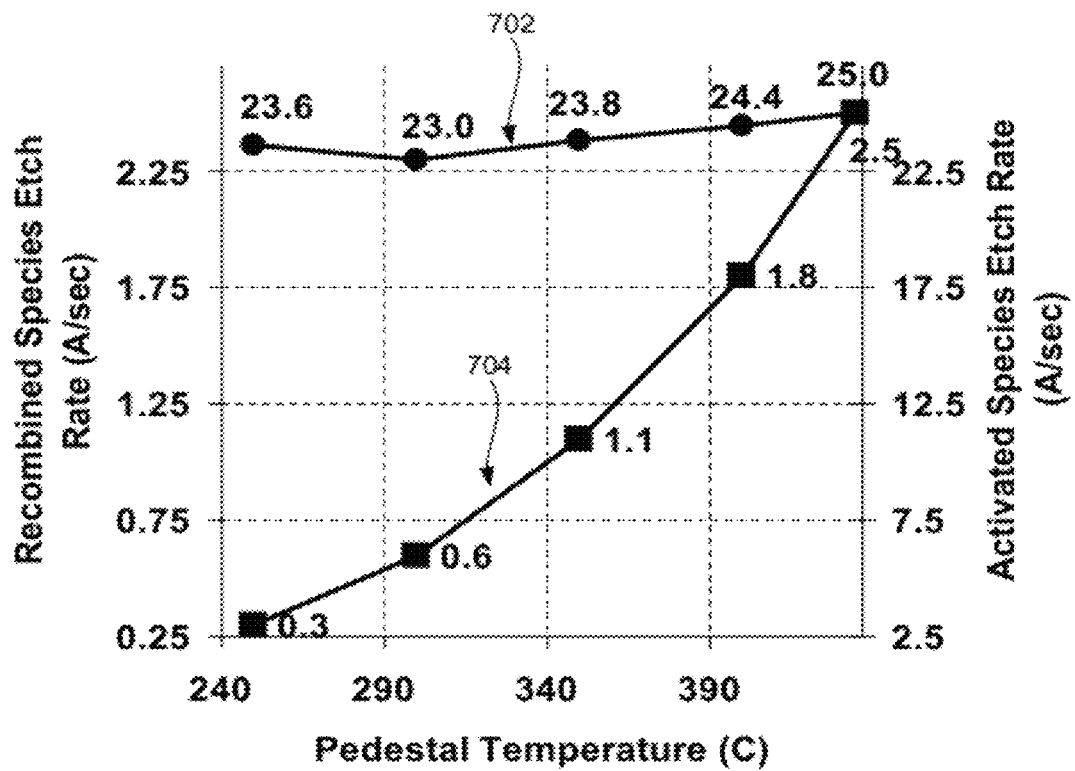
FIG. 7 is a plot of etching rates of activated fluorine species and recombined fluorine species as a function of the pedestal temperature.

FIG. 7 is a plot of two etching rates as a function of the pedestal temperature for activated species (line 702) and for recombined species (line 704). Etching tests were modeled using a nitrogen tri-fluoride precursor supplied into the processing chamber through a remote plasma generator at 400 sccm for 20 seconds (line 702) and a molecular fluorine precursor supplied at 500 sccm for 50 seconds (line 704). The chamber pressure was kept at 1 Torr during both tests. The results indicate that the etch rate corresponding to the recombined fluorine molecules (line 704) can be substantially reduced by lowering the pedestal temperature. At the same time, the etch rate corresponding to the activated species (line 702) remains relative flat, i.e., it is not as sensitive to the pedestal temperature as line 702.

In certain embodiments, it may be difficult to eliminate or even substantially minimize recombined species from contacting the substrate surface (e.g., to minimize recombination of activated species). For example, an apparatus typically include a showerhead (further explained in the context of FIG. 4), which causes substantial recombination of previously activated etchant species (e.g., flowing from a remote plasma generator through a showerhead). This may be a result, for example, of a longer residence time within a closed volume of the showerhead and its high surface-to-volume ratio. While recombination may be still present in the system, it has been determined that effect of recombined species of partial removal may be reduced by a substrate temperature during this operation. Atomic fluorine has much lower activation energy than molecular fluorine (0.33 eV v. 0.55 eV). This relationship generally holds for other activated and recombined species. As such, etching contributions of recombined species can be reduced by lowering temperature during the etching operation.

Another process parameter that may effect recombination of activated species is a pressure inside the chamber or, more specifically, partial pressures of different materials that may be present in the chamber (e.g., initial etchant materials, activated species, recombined species, carrier gases, reaction products, etc.). A higher total pressure (e.g., greater than about 10 Torr) generally corresponds to shorter mean free paths of the activated etchant species resulting in more collisions between the species, which in turn results in a higher recombination rate. Furthermore, it has been found that a sticking probability of some recombined species (e.g., molecular fluorine) on a tungsten surface or other similar surfaces is lower than that of activated species (e.g., atomic fluorine) at low pressure levels. A low sticking probability tends to improve step coverage.

Figure 8:
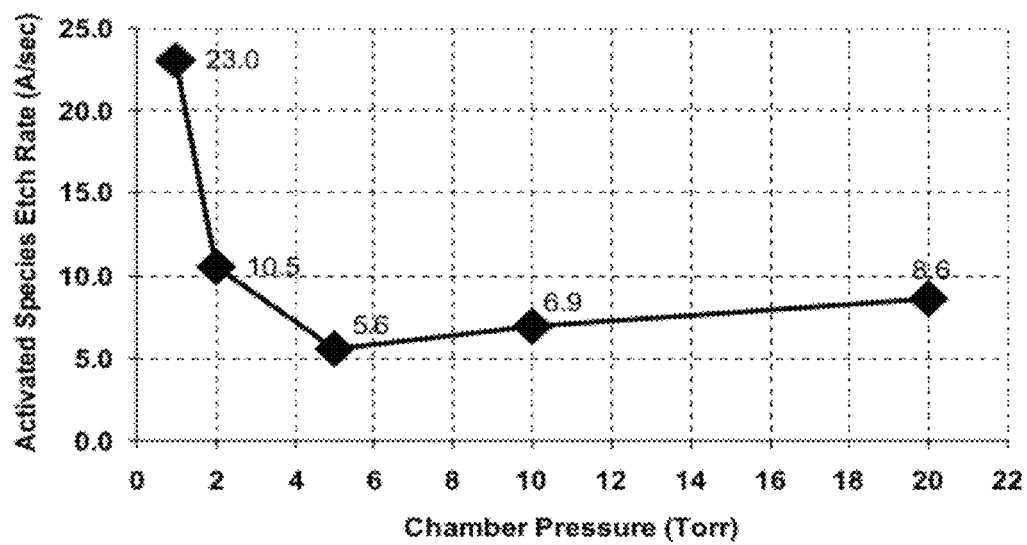
FIG. 8 is a plot of an etching rate of activated fluorine species as a function of the chamber pressure.

FIG. 8 is a plot of an etch rate as a function of the chamber pressure for a nitrogen tri-fluoride precursor supplied into the processing chamber at 400 sccm for 20 seconds. The substrate was kept at 300° C. during this experiment. The results show that between 1 Torr and 5 Torr an increase in pressure resulted in lower etching rates. Without being restricted to any particular theory, it is believed that higher pressures at this level leads to higher recombination rates of activated species into recombined species, which are less reactive leading to lower etching rates. This recombination and lower etching reactivity actually offsets any increases caused by higher overall etchant concentrations. As pressure further increased above 5 Torr, higher concentrations of etching materials results in some moderate increases in etching rates. It is believed that removal is predominantly controlled by the recombined species at this pressure levels. As such in order to have a greater contribution from activated species, a process chamber needs to be kept at lower overall pressure values. In certain embodiments, a process chamber is maintained at less than about 5 Torr, or more specifically at less than about 2 Torr, or even at less than about 1 Torr or less than about 0.1 Torr.

Returning to FIG. 2, the reduction in the average thickness of the deposited layer near the opening may be greater than that inside the feature as a result of the selective removal operation 205. In certain embodiments, the reduction near the opening is at least about 10% greater than the reduction inside the feature or, in more specific embodiments, is at least about 25% greater. The removal operation 205 may generally be performed up to the point at which the substrate or any underlayer, if one is present, is exposed to the etchant. The remaining layer may be characterized with step coverage. In certain embodiments, step coverage of the etched layer is at least about 75%, more specifically at least about 100%, or at least about 125%, more even more specifically at least about 150%.

In certain embodiments, a removal operation is performed such that a passivated surface is formed. This surface inhibits deposition of tungsten-containing materials in the subsequent deposition cycle. Forming a passivated surface is described below in the context of FIG. 2, though it should be noted that it is not so limited and may be performed in any tungsten deposition process by appropriately employing an etch process. Passivation, and thus subsequent tungsten deposition, may be selective or non-selective with respect to the feature depth or other geographic region of deposition surface, by appropriately tuning the etching conditions as described herein.

Returning to FIG. 2, in certain embodiments, the selective removal operation 205 is performed at certain process conditions that result in formation of a layer, which may be referred to as a remaining layer, having a passivated surface. In certain embodiments, the passivation is differential along the depth of the high aspect ratio features due to different etching conditions (e.g., concentrations of activated species) along this dimension as described above. For example, process conditions during this operation may be specifically tuned to cause more passivation near the features' openings than inside the features. Generally, these conditions correspond to low pressures (e.g., less than 8 Torr and even less than 5 Torr) and prolonged etching (e.g., more than 1 seconds and even more than 5 seconds for typical 30-nanometer features). This phenomenon will now be described in more detail with reference to FIG. 9.

Figure 9:
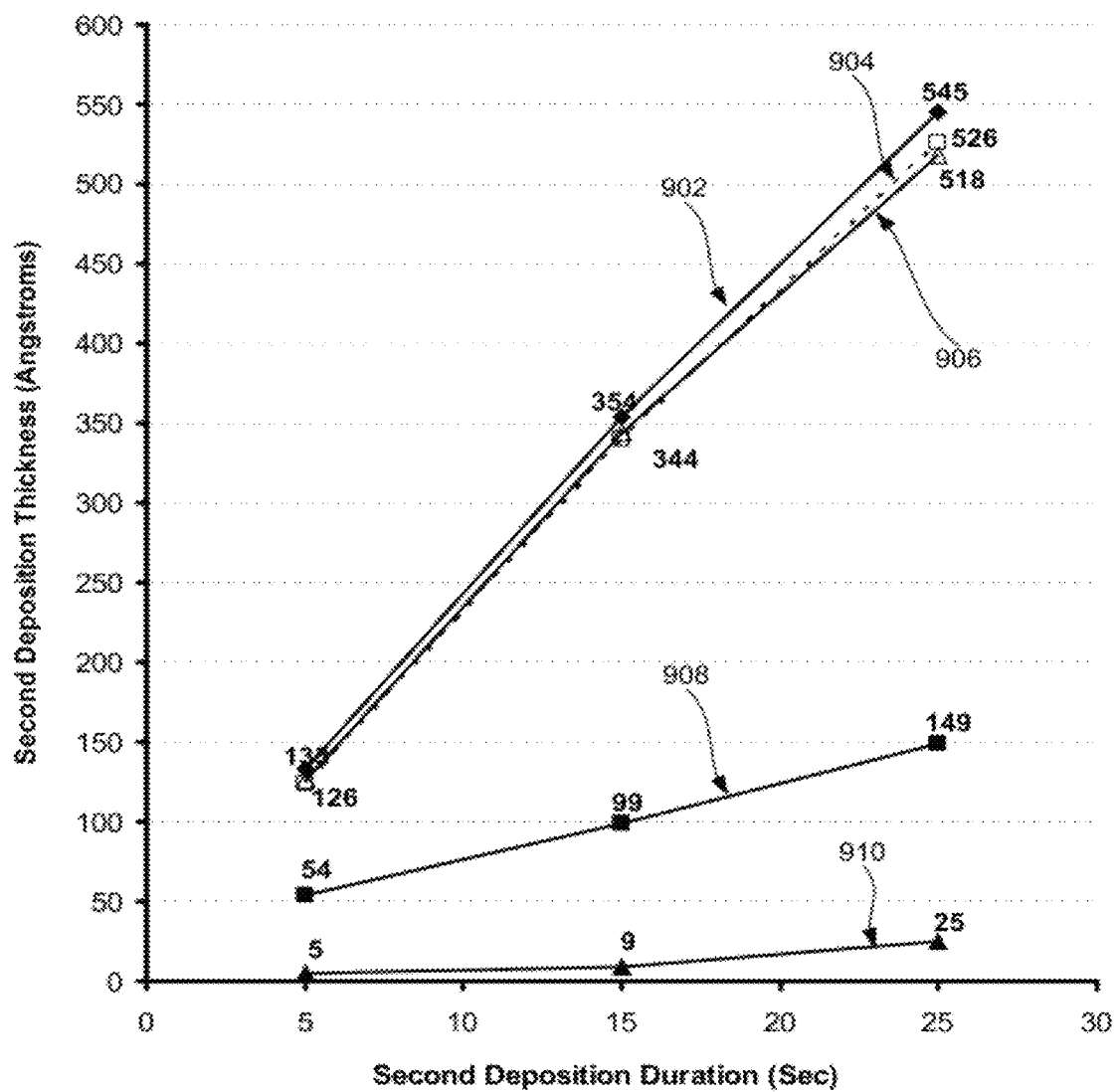
FIG. 9 is a plot of deposition thicknesses as a function of time for various samples processed using different etching conditions.

FIG. 9 is a plot of second deposition cycle deposition thicknesses as a function of time for five sets of wafers processed using different etching conditions. This plot illustrates effects of different passivation levels caused by these etching conditions on deposition rates. In this experiment, surfaces of the five sets of wafers were deposited with an initial tungsten layer. The same deposition conditions were used for all five sets. Then each set of wafers was processed using different etching conditions. The first set of wafers corresponding to line 902 in FIG. 9 (the top solid identified by numerical values 133, 354, and 545 in the plot) was not etched at all. In other words, the first deposition cycle was followed by the second deposition cycle without any intermediate etching cycles. The second set of wafers corresponding to line 904 (the middle dashed line identified by a numerical value 526; other numerical values not shown because of the close proximity to the other two lines) was etched at 18 Torr for a period of 7 seconds. The third set of wafers corresponding to line 906 (the bottom solid line in the top group of three lines identified by numerical values 126, 344, and 517) was etched at 18 Torr for a period of 17 seconds. The fourth set of wafers corresponding to line 908 (identified by numerical values 54, 99, and 149) was etched at 0.8 Torr for a period of 5 seconds. Finally, the fifth set of wafers corresponding to line 908 (identified by numerical values 5, 9, and 25) was etched at 0.8 Torr for a period of 10 seconds. These five sets of wafers were then subjected to same deposition conditions for three periods of time (i.e., 5 seconds, 15 seconds, and 25 seconds) to form addition tungsten layers. The resulting thicknesses of these additional tungsten layers are presented in FIG. 9.

FIG. 9 illustrates that the first three sets of wafers (i.e., the wafers subjected to no etching or etching at 18 Torr) have much thicker additional tungsten layers deposited in the second deposition cycle than the last two sets of wafers (i.e., the wafers subjected to etching at 0.8 Torr). As explained above with reference to FIG. 8, higher pressure levels may result in recombination of activated etching species (e.g., atomic fluorine into molecular fluorine) and, to a certain degree, different chemical reactions during etching. Resulting etched layers processed at different pressure levels during etching may have different characteristics, such as chemical compositions and/or physical structures, at least on their exposed surfaces. This, in turn, impacts deposition of the later deposited layers of tungsten as shown in FIG. 9. Specifically, FIG. 9 demonstrates that etching at a lower pressure and for a longer period of time results in a more passivated remaining layer that inhibits deposition of at least the subsequent layer. At the same time, lower pressure levels correspond to more aggressive etching as evidenced from FIG. 8. A combination of pressure and etching duration should be carefully controlled to prevent complete removal of the initial deposited layer and deteriorating the underlying diffusion barrier layer.

While some passivation is generally desirable near the feature's opening, it is less desirable and, in certain embodiments, should be avoided inside the feature. It has been found that at certain process conditions high aspect ratio features become differentially passivated during etching such that the remaining layer is more passivated near the opening than inside the feature. Without being restricted to any particular theory, it is believed that etching at lower pressure levels may result in mass-transport limiting conditions within high aspect ratio features where higher concentrations of the activated etchant species are present near the features' openings than inside the features. Some activated etchant species are consumed during etching the layer near the opening while some other activated species are recombined while diffusing into the features.

Figure 10:
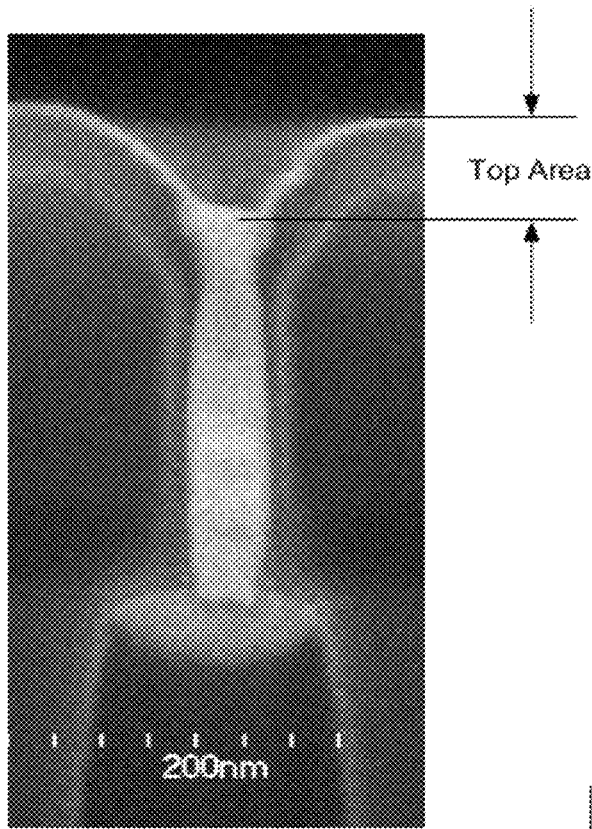
FIG. 10 illustrates a cross-sectional Scanning Electron Microscopy (SEM) image of a 30-nanometer feature after initial tungsten deposition, 3-second etch, and additional tungsten deposition.
Figure 11:
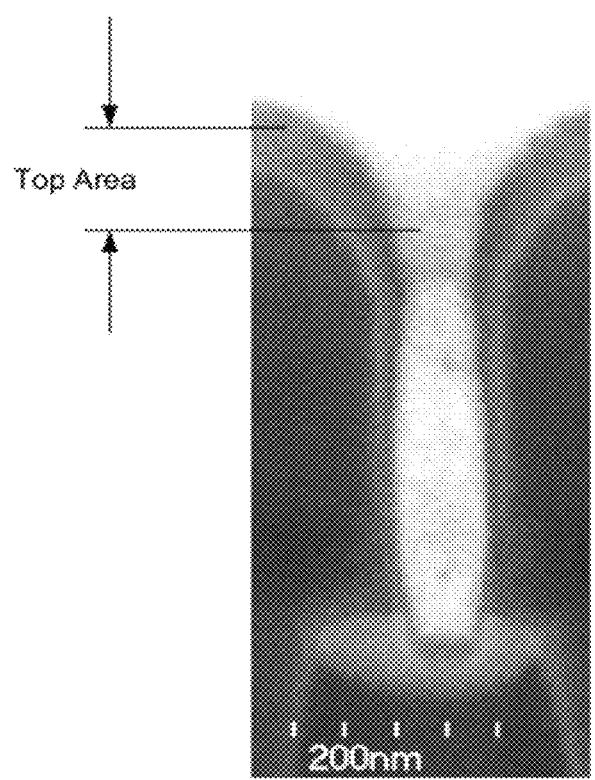
FIG. 11 illustrates a cross-sectional SEM image of another 30-nanometer feature after the same initial tungsten deposition, 1-second etch, and the same additional tungsten deposition.

Even passivation near the features' openings should be carefully controlled to prevent excessive passivation in these areas and allow for sufficient deposition during later operations in order to completely fill and close the feature. This concern is reflected in FIGS. 10 and 11. Specifically, FIG. 10 shows a cross-sectional Scanning Electron Microscopy (SEM) image of a 30-nanometer feature after initial tungsten deposition followed by 3-second etching and then additional tungsten deposition. The top area of this feature remained unfilled even thought the bottom area is completely filled. While a gradual bottom-up fill caused by differential passivation is desirable to avoid premature closing of the feature and formation of the seam, excessive passivation may result in unfilled features such as the one presented in FIG. 10, which may not be desirable or acceptable. FIG. 11 shows a cross-sectional SEM image of another 30-nanometer feature after the same initial tungsten deposition followed by 1-second etching and then the same additional tungsten deposition. The top portion of this feature was completely filled. In some cases, while some passivation near the features' opening is desirable, over-passivation is avoided.

In light of these considerations, process conditions may be specifically tuned to achieve desirable processing results, such as completely filling high aspect ratio features in a substantially void free manner. Some of these process conditions include performing the removal operation at a pressure of less than 5 Torr, or less than 2 Torr, or even less than 1 Torr. In certain embodiments, the pressure is maintained at between about 0.1 Ton and 5 Torr or, more specifically, between about 0.5 Torr and 3 Torr. Duration of the etching operation generally depends on a thickness of the initial layer, which, in turn, is generally kept to less than about a half of the feature size in order to prevent closing of the feature. For example, an initial layer deposited over the substrate surface containing 30-nanometer features is generally less than 15 nanometers. Such a layer may be etched for at least about 1 second or, more specifically, for at least about 3 seconds, or even at least about 5 seconds without damaging any of the underlying layers. In specific embodiments, duration of the etching operation is between about 1 and 10 seconds or, even more specifically, between about 3 and 5 seconds. Etching conditions may be also described with reference to the remaining layer and the size of the feature. In certain embodiments, the remaining layer has a thickness of less than 10% of the feature opening.

In certain embodiments, the substrate may include one or more features that are closed during the deposition operation 203 and remain closed during the selective removal operation 205. For example, a substrate may include small, medium size, and large features. Some small features may close during the initial deposition operation and never open again. Medium size features may close during later cycles and remain closed while other larger features are being filled. In certain embodiments, features may be present at different vertical levels of the substrates, e.g., in a dual-damascene arrangements. The features on lower-levels may close earlier than features in higher-levels.

In certain embodiments, the deposition operation 203 may only temporarily close the feature. Unlike closing the feature during a final filling operation, such as operation 213 described below, or in the situation with multiple features of different sizes and vertical positions described above, the seam during this temporary closure may be still unacceptably large or start too close to the field region. In these embodiments, the selective removal operation 205 may be designed in such a way that the first part of the operation 205 is used to re-open the feature and then the next part of the operation 205 is used for selective removal of the deposited material. The process conditions in these two parts may be the same or different. For example, the etchant flow rate may be higher during the first part of the operation 205 and then decreased as the feature opens up.

A deposition-removal cycle including the deposition operation 203 and the selective removal operation 205 may be repeated one or more times as indicated by decision block 207. For example, it may be difficult to achieve desirable step coverage after one cycle, particularly, in small features with large overhangs. Considerations in a decision 207 whether to proceed with another cycle include overhang size, feature size, feature aspect ratio, feature bowing, as well as seam size and seam location requirements.

In certain embodiments, process parameters for one or both operations in the next cycle may be changed (block 209). For example, net deposition during initial cycles may need to be greater than in the later cycles because the deposited layer is still thin layer and the risk of contamination during etching is high. At the same time, the cavity is more open initially and the risk of closing is lower. For example, initial deposition cycles may be performed at slower deposition rates (e.g., driven by lower temperatures and/or chamber pressure) to achieve greater control over amounts of the tungsten containing materials deposited on the partially manufactured substrate. Slower rates may lead to a more conformal deposition as described above, which may be needed for certain feature types, in particular small, high aspect ratio features. Subsequent deposition cycles may be performed at faster deposition rates (e.g., driven by higher temperatures and/or chamber pressure) since control over a deposited thickness may be less critical and/or previous deposition-etching cycles may have already modified profiles of the cavities in such way that these cavities are less likely to close prematurely. In other embodiments, deposition operation in later cycles may be performed at slower deposition rated because remaining cavities are smaller and may be prone to premature closing. Likewise, etching process conditions may modified from one cycle to another starting, for example, with less aggressive etching conditions while deposited layers are still thin and eventually turning to more aggressive etching conditions.

Returning to FIG. 3, cross-section 331 depicts the feature after selective removal. Thus, cross-sections 321 and 331 may represent the first cycle or, more generally, one of the initial cycles. The deposited layer 323 during this cycle may be too thin to completely compensate for or offset various seam formation causes, such as the overhang 315. For example, after the selective removal operation the cavity shown in cross-section 331 is still narrower near the opening than inside the feature. In certain embodiments, this difference (how much narrower) may be sufficiently small that the process continues to a final filling operation without repeating the deposition-removal cycle.

Cross-sections 341 and 351 illustrate the substrate 303 during and after later cycles. First, cross-section 341 shows a new deposited layer 343 formed over etched layer 333. The feature with layer 343 may have an improved profile reflecting better step coverage achieved during the previous cycles. However, the profile of the cavity may still not allow proceeding to final filling and another etching operation may be needed to further shape this cavity. Cross-section 351 represents the substrate 303 at a stage prior to a final deposition to complete the fill. The cavity is wider near the opening than inside the cavity. In certain embodiments, step coverage of the new deposited layer is at least about 10% greater than that of the initially deposited layer or, in more specific embodiments, at least about 20% greater or at least about 30% greater.

Returning to FIG. 2, in certain embodiments, the deposition operation 203 and the selective removal operation 205 may be performed simultaneously, which is represented by a block 204. For example, a precursor and an etchant may be flown into the processing chamber at the same time allowing for both deposition and etching reactions to occur simultaneously. In order to achieve greater net deposition inside the feature than near the opening, at least initially, the flow rates of the etchant and the tungsten-containing precursor may be such that the etching reaction is mass-transport limited and, therefore, depends on the etchant concentration. At the same time, the deposition reaction is not mass-transport limited and proceeds at about the same rates inside the feature and the opening. An etchant or precursor flow rate or both may be adjusted (e.g., gradually or in stepwise fashion) during the operation 204, and at some point the etchant flow into the processing camber may be discontinued. At this point, the process may transition to a final fill operation 213 described below.

After one or more deposition-removal cycles are performed to partially fill the feature and shape the feature profile, the process may then continue with a final filling operation 213. This operation may be in some aspects similar to the deposition operation 203. The main distinction is that the operation 213 proceeds until the feature is completely closed and it is not followed by an etching operation to open the feature. Returning to FIG. 3, cross-section 361 represents an example of substrate 303 after the final filling operation. In certain embodiments, the feature still has a seam 363, but it is smaller and has a reference point positioned further away from the field region than in a conventionally filled feature, such as the one illustrated in FIG. 1. In certain embodiments, the seam 363 ends at least about 20% from the field region relative to the depth of the feature (i.e., a ratio of $D_{REF}$ to $D_{FET}$ is at least about 20%).

In another embodiment, features are filled by depositing more tungsten inside the features than near the opening. Differential deposition rates may be achieved by inhibiting a surface onto which tungsten-containing materials are being deposited to different levels depending on the position within the feature (e.g., near the opening or inside the feature). Specifically, the surface near the opening may be inhibited more than the surface inside the feature. In a particular embodiment, an inhibitor is introduced into the processing chamber before a deposition operation. The exposed surface of the feature is treated with this inhibitor in a mass-transport limited regime similar to the one described above in the context of etching. However, unlike the etching operation no material is removed from the surface (i.e., no net etch) during inhibiting. For example, at certain process conditions fluorine-based etching of the deposited layer may lead to formation of residues (e.g., containing certain tungsten fluorides) on the surface of the remaining etched layer. These residues may act as an inhibitor in a subsequent deposition operation. Further, at certain process conditions no net removal of materials from the deposited layer may occur, but the deposited layer forms an inhibiting layer that is more prevalent near the opening than inside the feature. Filling the feature using differential deposition rates as may be done in conjunction with or in lieu of the deposition-removal operations described above.

Apparatus

Any suitable chamber may be used to implement this novel method. Examples of deposition apparatuses include various systems, e.g., ALTUS and ALTUS Max, available from Novellus Systems, Inc. of San Jose, Calif., or any of a variety of other commercially available processing systems.

Figure 4:
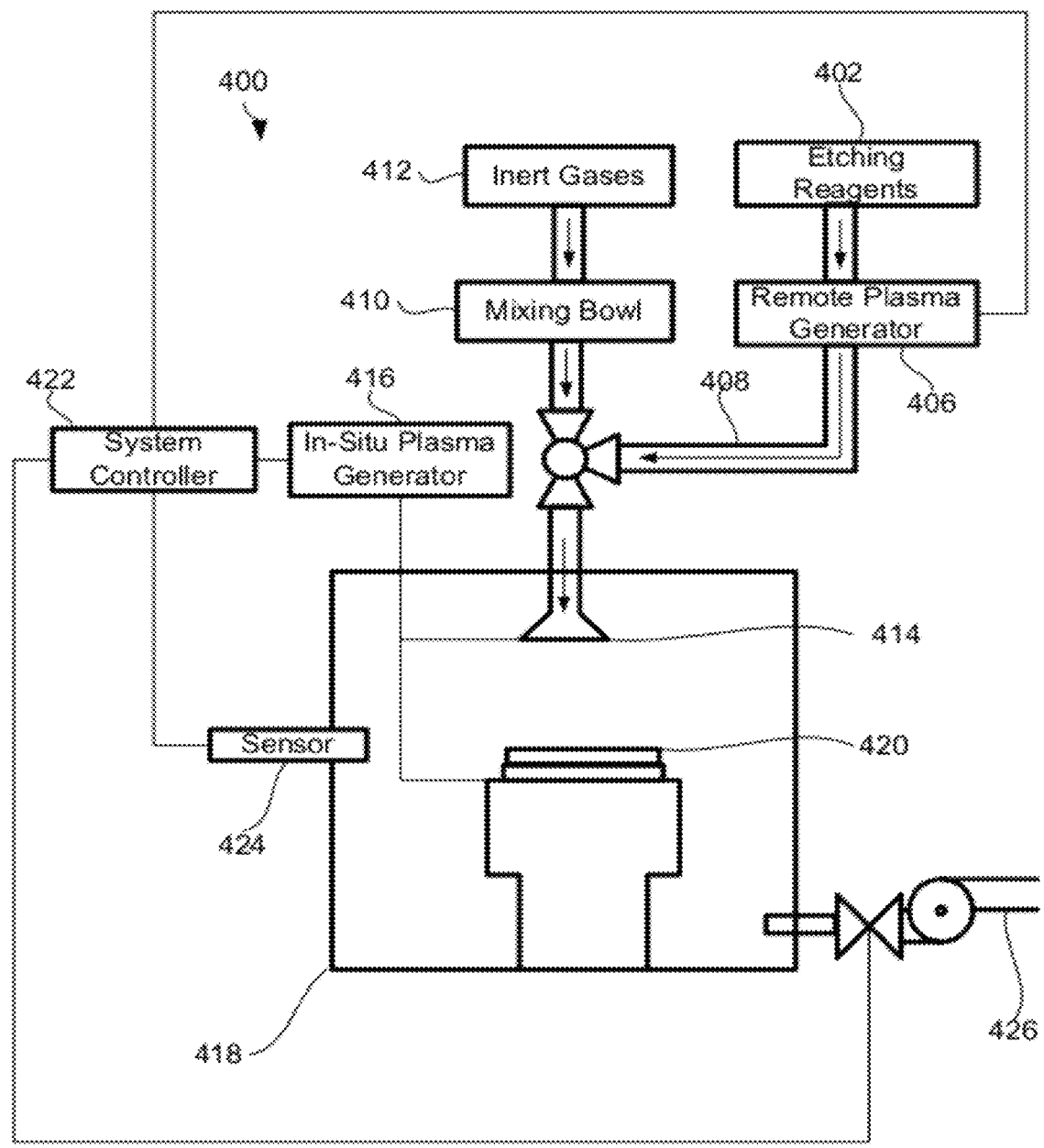
FIG. 4 illustrates a schematic representation of an apparatus, in accordance with certain embodiments, for filling high aspect ratio features.

FIG. 4 illustrates a schematic representation of an apparatus 400 for processing a partially fabricated semiconductor substrate in accordance with certain embodiments. The apparatus 400 includes a chamber 418 with a pedestal 420, a shower head 414, and an in-situ plasma generator 416. The apparatus 400 also includes a system controller 422 to receive input and/or supply control signals to various devices.

The etchant and, in certain embodiments, inert gases, such as argon, helium and others, are supplied to the remote plasma generator 406 from a source 402, which may be a storage tank. Any suitable remote plasma generator may be used for activating the etchant before introducing it into the chamber 418. For example, a Remote Plasma Cleaning (RPC) units, such as ASTRON® i Type AX7670, ASTRON® e Type AX7680, ASTRON® ex Type AX7685, ASTRON® hf-s Type AX7645, all available from MKS Instruments of Andover, Mass., may be used. An RPC unit is typically a self-contained device generating weakly ionized plasma using the supplied etchant. Imbedded into the RPC unit a high power RF generator provides energy to the electrons in the plasma. This energy is then transferred to the neutral etchant molecules leading to temperature in the order of 2000K causing thermal dissociation of these molecules. An RPC unit may dissociate more than 60% of incoming etchant molecules because of its high RF energy and special channel geometry causing the etchant to adsorb most of this energy.

In certain embodiments, an etchant is flown from the remote plasma generator 406 through a connecting line 408 into the chamber 418, where the mixture is distributed through the shower head 414. In other embodiments, an etchant is flown into the chamber 418 directly completely bypassing the remote plasma generator 406 (e.g., the system 400 does not include such generator). Alternatively, the remote plasma generator 406 may be turned off while flowing the etchant into the chamber 418, for example, because activation of the etchant is not needed.

The shower head 414 or the pedestal 420 typically may have an internal plasma generator 416 attached to it. In one example, the generator 416 is a High Frequency (HF) generator capable of providing between about 0 W and 10,000 W at frequencies between about 1 MHz and 100 MHz. In a more specific embodiment, the HF generator may deliver between about 0 W to 5,000 W at about 13.56 MHz. The RF generator 416 may generate in-situ plasma to enhance removal of the initial tungsten layer. In certain embodiments, the RF generator 416 is not used during the removal operations of the process.

The chamber 418 may include a sensor 424 for sensing various process parameters, such as degree of deposition and etching, concentrations, pressure, temperature, and others. The sensor 424 may provide information on chamber conditions during the process to the system controller 422.

Examples of the sensor 424 include mass flow controllers, pressure sensors, thermocouples, and others. The sensor 424 may also include an infra-red detector or optical detector to monitor presence of gases in the chamber and control measures.

Deposition and selective removal operations generate various volatile species that are evacuated from the chamber 418. Moreover, processing is performed at certain predetermined pressure levels the chamber 418. Both of these functions are achieved using a vacuum outlet 426, which may be a vacuum pump.

In certain embodiments, a system controller 422 is employed to control process parameters. The system controller 422 typically includes one or more memory devices and one or more processors. The processor may include a CPU or computer, analog and/or digital input/output connections, stepper motor controller boards, etc. Typically there will be a user interface associated with system controller 422. The user interface may include a display screen, graphical software displays of the apparatus and/or process conditions, and user input devices such as pointing devices, keyboards, touch screens, microphones, etc.

In certain embodiments, the system controller 422 controls the substrate temperature, etchant flow rate, power output of the remote plasma generator 406, pressure inside the chamber 418 and other process parameters. The system controller 422 executes system control software including sets of instructions for controlling the timing, mixture of gases, chamber pressure, chamber temperature, and other parameters of a particular process. Other computer programs stored on memory devices associated with the controller may be employed in some embodiments.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, etchant flow rates, etc. These parameters are provided to the user in the form of a recipe, and may be entered utilizing the user interface. Signals for monitoring the process may be provided by analog and/or digital input connections of the system controller 422. The signals for controlling the process are output on the analog and digital output connections of the apparatus 400.

Multi-Station Apparatus

Figure 5A:
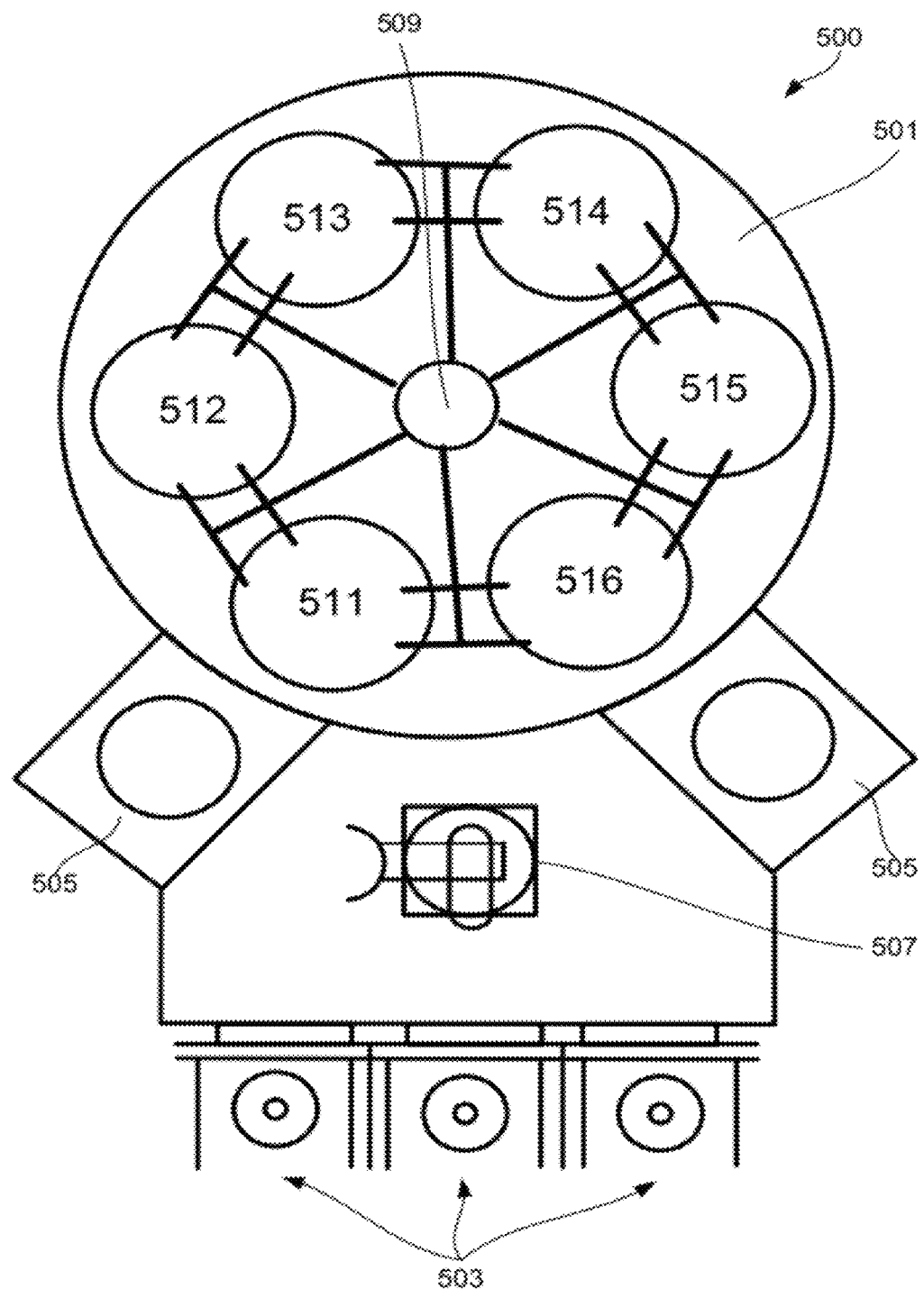
FIG. 5A shows a schematic illustration of a multi-station apparatus, in accordance with certain embodiments, for filling high aspect ratio features.

FIG. 5A shows an example of a multi-station apparatus 500. The apparatus 500 includes a process chamber 501 and one or more cassettes 503 (e.g., Front Opening Unified Ports) for holding substrates to be processed and substrates that have completed processing. The chamber 501 may have a number of stations, for example, two stations, three stations, four stations, five stations, six stations, seven stations, eight stations, ten stations, or any other number of stations. The number of stations in usually determined by a complexity of the processing operations and a number of these operations that can be performed in a shared environment. FIG. 5A illustrates the process chamber 501 that includes six stations, labeled 511 through 516. All stations in the multi-station apparatus 500 with a single process chamber 503 are exposed to the same pressure environment. However, each station may have a designated reactant distribution system and local plasma and heating conditions achieved by a dedicated plasma generator and pedestal, such as the ones illustrated in FIG. 4.

A substrate to be processed is loaded from one of the cassettes 503 through a load-lock 505 into the station 511. An external robot 507 may be used to transfer the substrate from the cassette 503 and into the load-lock 505. In the depicted embodiment, there are two separate load locks 505. These are typically equipped with substrate transferring devices to move substrates from the load-lock 505 (once the pressure is equilibrated to a level corresponding to the internal environment of the process chamber 503) into the station 511 and from the station 516 back into the load-lock 505 for removal from the processing chamber 503. An internal robot 509 is used to transfer substrates among the processing stations 511-516 and support some of the substrates during the process as described below.

In certain embodiments, one or more stations may be reserved for heating the substrate. Such stations may have a heating lamp (not shown) positioned above the substrate and/or a heating pedestal supporting the substrate similar to one illustrated in FIG. 4. For example, a station 511 may receive a substrate from a load-lock and be used to pre-heat the substrate before being further processed. Other stations may be used for filling high aspect ratio features including deposition and selective removal operations.

After the substrate is heated or otherwise processed at the station 511, the substrate is moved successively to the processing stations 512, 513, 514, 515, and 516, which may or may not be arranged sequentially. The multi-station apparatus 500 is configured such that all stations are exposed to the same pressure environment. In so doing, the substrates are transferred from the station 511 to other stations in the chamber 501 without a need for transfer ports, such as load-locks.

The internal robot 509 is used to transfer substrates between stations 511-516. The robot 509 includes a fin with at least one arm for each processing station (shown extending between stations). At the end of the arm adjacent to the processing stations are four fingers that extend from the arm with two fingers on each side. These fingers are used to lift, lower, and position a substrate within the processing stations. For example, in one embodiment, where the multi-station apparatus includes six processing stations, the spindle assembly is a six arm rotational assembly with six arms on one fin. For example, as shown in the drawings the fin of the spindle assembly includes six arms, with each arm having four fingers. A set of four fingers, i.e., two fingers on a first arm and two fingers on an adjacent, second arm, are used to lift, position and lower a substrate from one station to another station. In this manner, the apparatus is provided with four fingers per pedestal, per station and per substrate.

In certain embodiments, one or more stations may be used to fill features with tungsten-containing materials. For example, stations 512 may be used for an initial deposition operation, station 513 may be used for a corresponding selective removal operation. In the embodiments where a deposition-removal cycle is repeated, stations 514 may be used for another deposition operations and station 515 may be used for another partial removal operation. Section 516 may be used for the final filling operation. It should be understood that any configurations of station designations to specific processes (heating, filling, and removal) may be used.

As an alternative to the multi-station apparatus described above, the method may be implemented in a single substrate chamber or a multi-station chamber processing a substrate(s) in a single processing station in batch mode (i.e., non-sequential). In this aspect of the invention, the substrate is loaded into the chamber and positioned on the pedestal of the single processing station (whether it is an apparatus having only one processing station or an apparatus having multi-stations running in batch mode). The substrate may be then heated and the deposition operation may be conducted. The process conditions in the chamber may be then adjusted and the selective removal of the deposited layer is then performed. The process may continue with one or more deposition-removal cycles and with the final filling operation all performed on the same station. Alternatively, a single station apparatus may be first used to perform only one of the operation in the new method (e.g., depositing, selective removal, final filling) on multiple wafers after which the substrates may be returned back to the same station or moved to a different station (e.g., of a different apparatus) to perform one or more of the remaining operations.

Multi-Chamber Apparatus

Figure 5B:
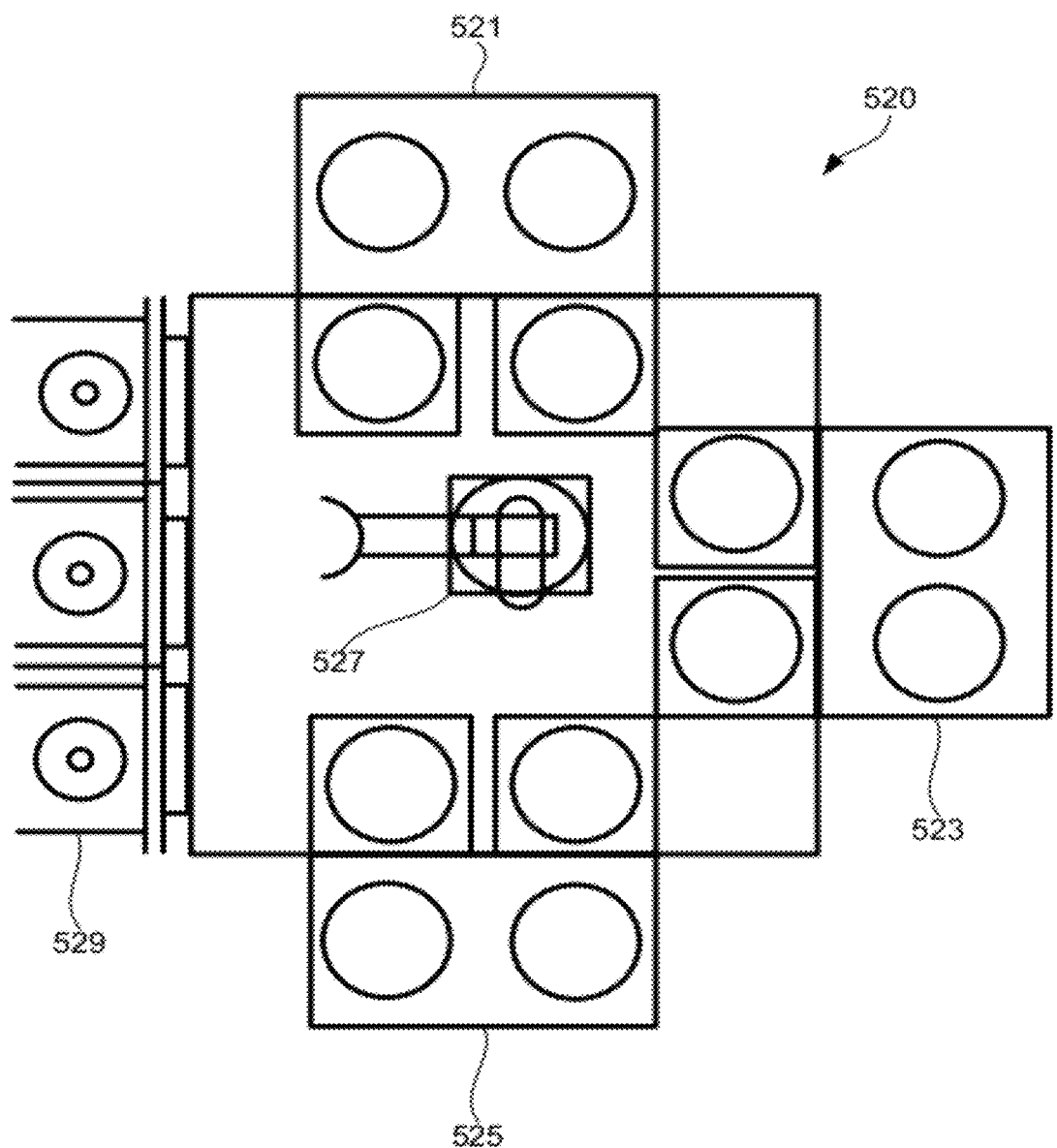
FIG. 5B is a schematic illustration of a multi-chamber apparatus, in accordance with certain embodiments, for filling high aspect ratio features.

FIG. 5B is a schematic illustration of a multi-chamber apparatus 520 that may be used in accordance with certain embodiments. As shown, the apparatus 520 has three separate chambers 521, 523, and 525. Each of these chambers is illustrated with two pedestals. It should be understood that an apparatus may have any number of chambers (e.g., one, two, three, four, five, six, etc.) and each chamber may have any number of chambers (e.g., one, two, three, four, five, six, etc.). Each chamber 521-525 has its own pressure environment, which is not shared between chambers. Each chamber may have one or more corresponding transfer ports (e.g., load-locks). The apparatus may also have a shared substrate handling robot 527 for transferring substrates between the transfer ports one or more cassettes 529.

As noted above, separate chambers may be used for depositing tungsten containing materials and selective removal of these deposited materials in later operations. Separating these two operations into different chambers can help to substantially improve processing speeds by maintaining the same environmental conditions in each chamber. In other words, a chamber does not need to change its environment from conditions used for deposition to conditions used for selective removal and back, which may involve different precursors, different temperatures, pressures, and other process parameters. In certain embodiments, it is faster to transfer partially manufactured semiconductor substrates between two or more different chambers than changing environmental conditions of these chambers.

Patterning Method/Apparatus:

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Experimental

A series of experiments were conducted to determine effects of different process conditions on selective removal of the deposited materials and resulting seam. It was found that increasing a substrate temperature and reducing an etchant flow rate can lead to mass-transport limited etching inside the feature resulting in more material etched away near the opening than inside the feature.

In one experiment, different etching conditions and their effects on step coverage were evaluated. Substrates with features that have openings of approximately 250 nanometers in cross-section and an aspect ratio of approximately 10:1 were used. The features were first partially filled with tungsten at about 395° C. substrate temperature, about 200 sccm flow rate of the tungsten fluoride ($WF_6$) in argon and hydrogen environment. Several substrates were then cross-sectioned in order to analyze tungsten distribution within the features. It was found that the layer was slightly thinner inside the features (about 862 Angstroms thick on average) than around the openings (about 639 Angstroms thick on average) leading to step coverage of about 62%.

The remaining substrates were divided into two groups. Substrates in the first group were etched using reference process conditions: a chamber pressure of approximately 8 Torr, a substrate temperature of approximately 350° C., a flow rate of nitrogen tri-fluoride (NF3) of approximately 2,000 sccm, and etching duration of approximately 4 seconds. Several substrates from this group were cross-sectioned after the etching to further analyze tungsten distribution within the features. It was determined that the opening thickness (a thickness of the tungsten layer near the opening) was on average about 497 Angstroms, while the inside thickness was on average about 464 Angstroms, for a step coverage of about 107%.

The second group of wafers was etched using different ("improved") process conditions. These new conditions were believed to push the etching inside the feature into the mass-transport limited regime and, thus, improve the step coverage even more. The substrate temperature was increased to approximately 395° C., while the etchant flow rate was reduced to approximately 400 sccm. The etching was performed in a chamber maintained at about 2 Torr for approximately 12 seconds. The remaining etched layer was significantly thicker inside the features (about 555 Angstroms thick on average) than near the openings (about 344 Angstroms thick on average). The calculated step coverage is about 161%.

Figure 6A:
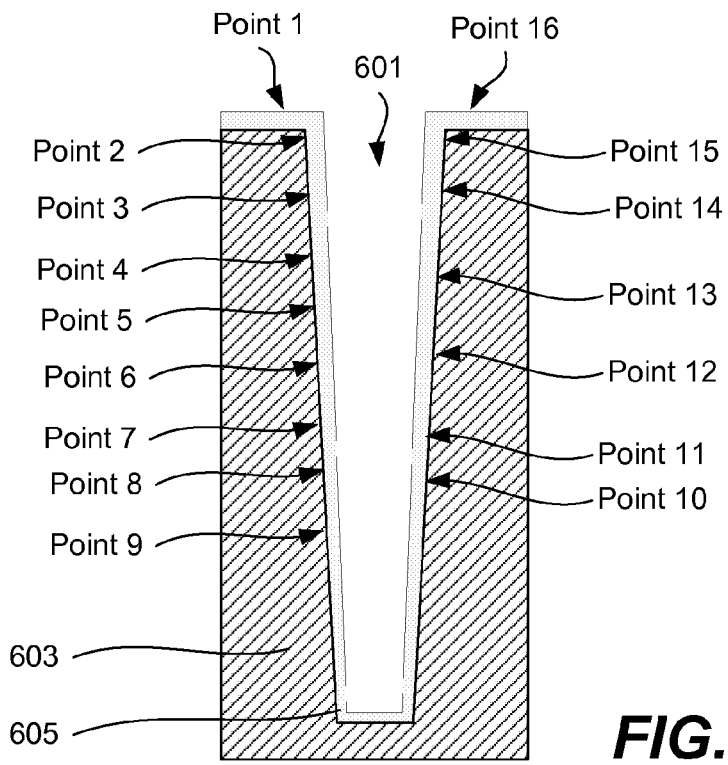
FIG. 6A illustrates a schematic representation of a feature provided in a partially manufactured semiconductor substrate with a tungsten-containing layer deposited in the feature and specifies different points of measurements of the layer thickness.
Figure 6B:
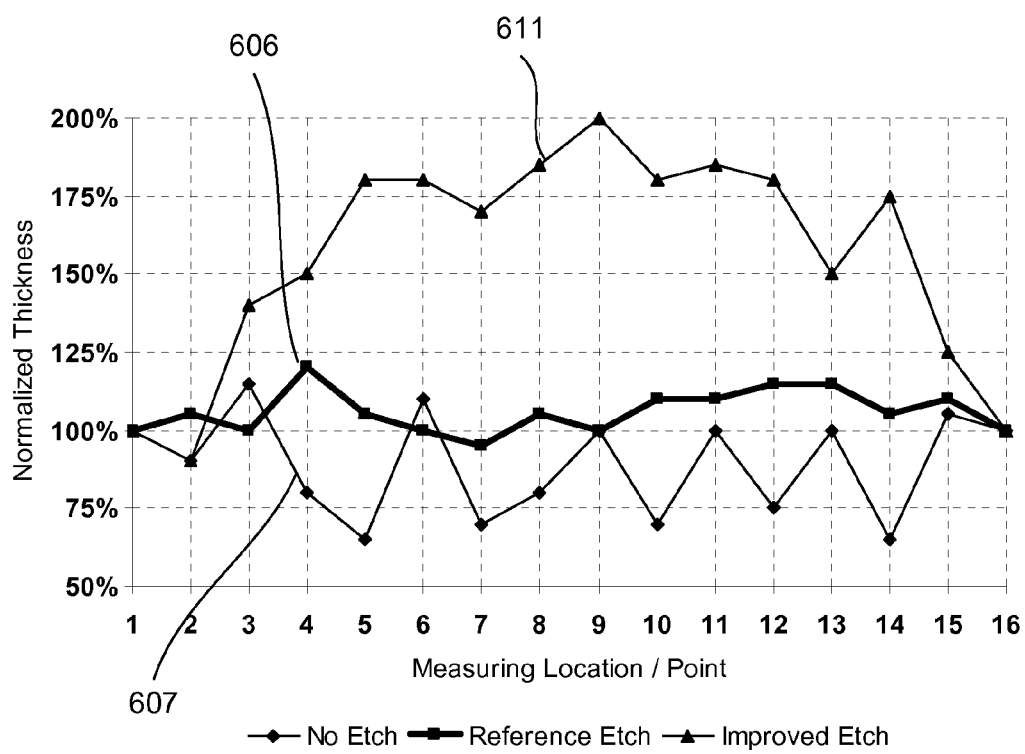
FIG. 6B illustrates a graph of the thickness distribution of the tungsten-containing layer shown in FIG. 6A before etching and after etching for two different process conditions.

FIG. 6A illustrates a schematic representation of a feature 601 provided in a partially manufactured semiconductor substrate 603 with a tungsten-containing layer 605 formed with the feature 601 similar to the one used in the above experiment. The figure also specifies different points of measurements of the layer thickness. FIG. 6B illustrates a graph of the thickness distribution of the tungsten-containing layer for the experiment described above before etching and after etching for two different process conditions. The horizontal axis of this graph corresponds to the measuring points illustrated in FIG. 6A. Thickness values provided in the graph are normalized to the respective values on the field region (points 1 and 16). The bottom thin line 607 represents thickness distribution within the feature prior to any etching. This line indicates that the layer is generally slightly thinner inside the feature than near the opening after deposition. The middle thick line 609 represents thickness distribution for the substrates etched with the reference etching conditions. This distribution indicates slightly greater step coverage than the one represented by the line 607. Finally, the top thin line 611 represents distribution of tungsten that was etched using the "improved" conditions. It reveals substantially improved step coverage. The thickness at the lowest (deepest) measured points (points 8, 9, and 10, which were approximately 30-40% of the feature's depth from the feature's bottom), is almost twice greater than the thickness near the field region (points 1, 2, 15, and 16).

CONCLUSION

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A method of filling a high aspect ratio feature provided on a substrate, the method comprising:
    introducing a tungsten-containing precursor and a reducing agent into a processing chamber;
    depositing a layer of a tungsten-containing material on the substrate via a chemical vapor deposition reaction between the tungsten-containing precursor and the reducing agent, such that the layer partially fills the high aspect ratio feature; and
    selectively removing a portion of the layer using an etching material to form a remaining layer,
    wherein the selective removal is performed without using an in-situ plasma and further wherein the selective removal is performed in a mass transport regime corresponding to a lower concentration of the etching material inside the high aspect ratio feature than near the opening of the high aspect ratio feature, wherein the etching material comprises multiple components, the multiple components having different relative concentrations throughout the depth of the high aspect ratio feature during the selective removal.

2. The method of claim 1, wherein a temperature of the substrate during selective removal is at least about 300 degrees Centigrade.

3. The method of claim 1, wherein the etching material comprises one or more of molecular fluorine and atomic fluorine.

4. The method of claim 1, wherein the etching material is introduced into the processing chamber at a flow rate of less than about 2,000 sccm to achieve the mass transport regime.

5. The method of claim 1, wherein the etching material is introduced into the processing chamber at a flow rate of less than about 1,000 sccm to achieve the mass transport regime.

6. The method of claim 1, wherein the etching material is introduced into the processing chamber at a flow rate of less than about 500 sccm to achieve the mass transport regime.

7. The method of claim 1 further comprising repeating the deposition operation and the selective removal operation.

8. The method of claim 7, wherein the selective removal operation is repeated using different process conditions than the prior selective removal operation.

9. The method of claim 1, wherein depositing the layer of a tungsten-containing material and selectively removing the portion of the layer is performed in the same processing chamber.

10. The method of claim 9, wherein depositing the layer of a tungsten-containing material and selectively removing the portion of the layer is performed on different stations.

11. The method of claim 9, wherein depositing the layer of a tungsten-containing material and selectively removing the portion of the layer is performed on a same station.

12. The method of claim 1, wherein depositing the layer of a tungsten-containing material and selectively removing the portion of the layer is performed in different processing chambers.

13. The method of claim 1, wherein the etching material is introduced into the processing chamber from a remote plasma generator.

* * * * *